United States Patent
Dosaka (12)

(10) Patent No.: US 6,768,699 B2
(45) Date of Patent: Jul. 27, 2004

(54) SEMICONDUCTOR INTEGRATED CIRCUIT DEVICE WITH EMBEDDED SYNCHRONOUS MEMORY PRECISELY OPERATING IN SYNCHRONIZATION WITH HIGH SPEED CLOCK

(75) Inventor: Katsumi Dosaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/368,480

(22) Filed: Feb. 20, 2003

(65) Prior Publication Data

US 2004/0004900 A1 Jan. 8, 2004

(30) Foreign Application Priority Data

Jul. 4, 2002 (JP) ........................................ 2002-196094

(51) Int. Cl.[7] ................................................ G11C 8/00
(52) U.S. Cl. .................................. 365/233; 365/230.06
(58) Field of Search ........................... 365/233, 230.06, 365/63

(56) References Cited

U.S. PATENT DOCUMENTS

| | | | |
|---|---|---|---|
| 2002/0027823 A1 | 3/2002 | Watanabe et al. | |
| 2002/0080677 A1 | 6/2002 | Watanabe et al. | |
| 2002/0159325 A1 | * 10/2002 | Kashiwazaki | ................ 365/233 |
| 2004/0004900 A1 | * 1/2004 | Dosaka | .................. 365/230.06 |

* cited by examiner

*Primary Examiner*—Huan Hoang
(74) *Attorney, Agent, or Firm*—Leydig, Voit & Mayer, Ltd.

(57) ABSTRACT

In a semiconductor integrated circuit with an embedded memory, main control signal generating circuits, each generating main control signals, are sequentially activated and a prescribed main control signal generating circuit in a prescribed sequence is reset when a predetermined main control signal is activated. A local control signal is generated using rising edges of main control signals of one set and falling edges of main control signals of another set, among sets of the main control signals. Thereby, internal timing control signals changing at a high speed can be generated without suffering a restraint on a pulse width of a pulse signal due to an internal interconnection load.

9 Claims, 21 Drawing Sheets

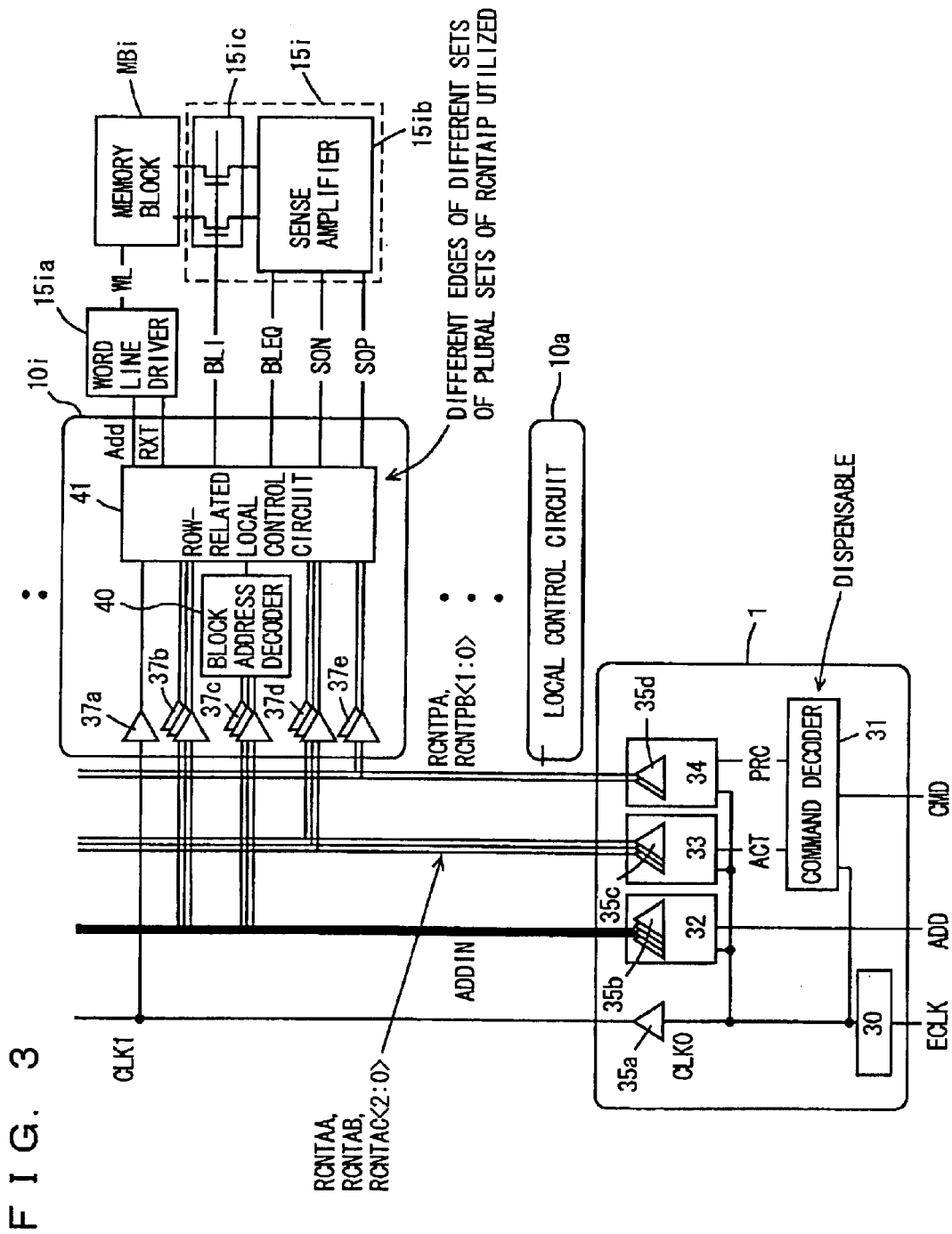
F I G. 3

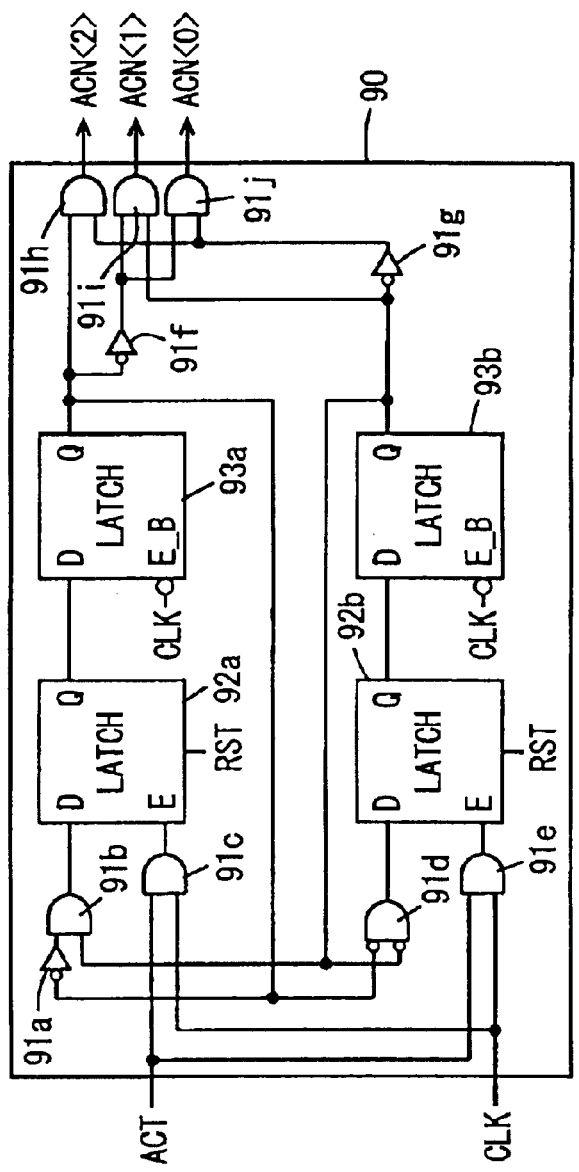
FIG. 10A
FIG. 10B
FIG. 10C

SEMICONDUCTOR INTEGRATED CIRCUIT DEVICE WITH EMBEDDED SYNCHRONOUS MEMORY PRECISELY OPERATING IN SYNCHRONIZATION WITH HIGH SPEED CLOCK

BACKGROUND OF THE INVENTION

1. Field of the Invention

The present invention relates to a semiconductor integrated circuit device, and particularly to a semiconductor integrated circuit device with embedded semiconductor memory device of a large storage capacity. More particularly, the present invention relates to a configuration of a row-related control circuit controlling a row select operation in a clock synchronous DRAM (dynamic random access memory) transferring data in synchronization with a clock signal.

2. Description of the Background Art

FIG. 24 is a diagram schematically showing an overall configuration of a conventional semiconductor memory device. In FIG. 24, the semiconductor memory device includes: a plurality of sub-memory arrays SMA0 to SMA3; row decoders RD0 to RD3 provided corresponding to respective sub-memory arrays SMA0 to SMA3 and each selecting a row of a corresponding sub-memory array; a column decoder CDA provided corresponding to sub-memory arrays SMW0 and SMA2 to generate a column select signal selecting a column of sub-memory arrays SMA0 and SMA2; a column decoder CDB provided corresponding to sub-memory arrays SMA1 and SMA3 to generate a column select signal selecting a column of sub-memory arrays SMA1 and SMA3; a data path DPA for supplying/receiving data to/from a memory cell on a column selected by column decoder CDA; and a data path DPB for supplying/receiving data to/from a memory cell on a column selected by column decoder CDB. Data paths DPA and DPB each include data input circuitry (an input buffer and a write buffer) and data output circuitry (an output buffer and a preamplifier).

Sub-memory arrays SMA0 and SMA1 constitute a bank BA#1 and sub-memory arrays SMA2 and SMA3 constitute a bank BA#0. A main control circuit MCK is provided in common to banks BA#1 and BA#0 and receives an address signal ADD and a command CMD instructing a operating mode in synchronization with a clock signal CLK to generate an operation control signal for banks BA#0 and BA#1.

The semiconductor memory device is a clock synchronous semiconductor memory device operating in synchronization with clock signal CLK, a control signal and an address signal are supplied in synchronization with clock signal CLK and data DQ is transferred in synchronization with clock signal CLK.

A sub-control circuit SCK0 is provided to bank BA#0 and a sub-control circuit SCK1 is provided to bank BA#1.

A main control circuit MCK generates an operation control signal for a bank designated according to a bank address included in address signal ADD. Sub-control circuits SCK0 and SCK1 each generate a control signal for performing a designated operation according to a main operation control signal from main control circuit MCK. Each of sub-control circuits SCK0 and SCK1 operates according to an operation control signal from main control circuit MCK independently of the other.

By dividing a memory array into two banks BA#0 and BA#1 as shown in FIG. 24, banks BA#0 and BA#1 can be activated/deactivated independently of each other by sub-control circuits SCK0 and SCK1. Activation of a bank indicates a state that a memory cell row is placed in a selected state in the bank. By making a data access in an interleaved manner to banks BK#0 and BK#1, a high speed access can be achieved without a penalty on page switching.

FIG. 25 shows a configuration of sub-memory arrays SMA0 to SMA3 shown in FIG. 24 schematically. Sub-memory arrays SMA0 to SMA3 are of the same configuration, and therefore, in FIG. 25, there is representatively shown one sub-memory array SMA.

In FIG. 25, sub-memory array SMA includes: a plurality of memory blocks MB0 to MB7; sense amplifier bands SAB1 to SAB7 each placed between adjacent two memory blocks of memory blocks MB0 to MB7 and sense amplifier bands SAB0 and SAB8 placed outside the respective memory blocks MB0 and MB7.

Memory cells are arranged in rows and columns in each of memory blocks MB0 to MB7. Sense amplifying circuits are provided corresponding to memory cell columns of memory blocks MB0 to MB7 in sense amplifier bands SAB0 to SAB8. Sense amplifier bands SAB0 to SAB8 are arranged in a so-called "alternate arrangement type shared sense amplifier configuration", in which sense amplifying circuits are arranged alternately on both sides of columns in a corresponding memory block and each sense amplifying circuit is shared between adjacent blocks.

In a sub-memory array SMA, a row select operation is performed in units of blocks. A memory block is designated by a block select signal generated according to a block address signal included in address signal ADD, and row selection is performed in the designated memory block.

One or two memory blocks are designated at a time. In a case where two memory blocks are simultaneously designated, one memory block is selected among 4 memory blocks in the upper side and one of 4 memory blocks in the lower side is selected. Memory blocks sharing a sense amplifier band are not selected simultaneously.

As sub-memory array SMA is divided into a plurality of memory blocks MB0 to MB7, sub-control circuits SCK0 and SCK1 each are divided into local control circuits corresponding to respective memory blocks MB0 to MB7.

In sub-memory array SMA, as shown in FIG. 25, partial activation operation (activation in a block basis) is performed with non-selected memory blocks maintained in a precharge state, reducing a current consumption.

Sub-memory arrays SMA shown in FIG. 25 are arranged in each of banks BA#0 and BA#1. Therefore, at a boundary between banks BA#0 and BA#1, sense amplifier band SAB8 of bank BA#1 and sense amplifier band SAB0 of bank BA#0 abut on each other. Banks BA#0 and BA#1 share no sense amplifier band and the sense amplifier bands of these banks BA#0 and BA#1 can be activated and deactivated independently of each other.

FIG. 26 is a diagram schematically showing sub-control circuits SCK0 and SCK1 shown in FIG. 25 schematically. Sub-memory array SMA2 included in bank BA#0 includes memory blocks MB00 to MB07. Sub-memory array SMA0 included in bank BA#1 includes memory blocks MB10 to MB17. Sense amplifier bands are arranged on both sides of each of memory blocks MB00 to MB07 and on both sides of each of memory blocks MB10 to MB17. In FIG. 26, there are shown sense amplifier bands each with a rectangular region.

Sub-control circuit SCK0 includes local control circuits LCK00 to LCK07 provided corresponding to respective memory blocks MB00 to MB07 and sub-control circuit SCK1 includes local control circuits LCK10 to LCK17 provided corresponding to respective memory blocks MB10 to MB17.

Main control circuit MCK generates a row-related control signal group BRC and a predecode block address PBA for each bank according to a command CMD and address signal ADD externally applied and further generates an internal clock CLK in synchronization with an external clock signal ECLK. Internal clock CLK from main control circuit MCK is applied commonly to local control circuits LCK00 to LCK07 and LCK10 to LCK17.

Row-related control signal group BRC specific to each bank includes a row-related control signal BR0 for bank BA#0 and a row-related control signal BR1 for bank BA#1. Row-related control signal BR0 is applied commonly to local control circuits LCK00 to LCK07 and row-related control signal BR1 is applied commonly to local control circuits LCK10 to LCK17.

Predecode block address signal PBA is generated by predecoding a block address included in external address ADD. Since banks BA#0 and BA#1 each include 8 memory blocks, predecode block address PBA of 6 bits is generated. Predecode address signal of 2 bits designates the upper half or lower half of memory blocks of each of banks BA#0 and BA#1 and predecode signal PBG1 of the remaining 4 bits designates one memory block in the memory blocks in each of the upper half and lower half. Therefore, one bit out of each of predecode block address PBG0 and PBG1 is applied to a respective one of local control circuits LCK00 to LCK07 and LCK10 to LCK17.

In banks BA#0 and BA#1, memory blocks are designated by common predecode block address PBA. A row-related signal for a bank designated by a bank address included in bank address ADD is activated by row-related control signal group BRC specific to the bank, and an operation related to row selection is performed.

Note that in FIG. 26, there is shown no configuration of sub-memory arrays SMA1 and SMA3, for the sake of simplification of the drawing. Sub-memory arrays SMA1 and SMA3 have a configuration similar to that of sub-memory arrays SMA0 and SMA2 and a row select operation is controlled by local control circuits LCK00 to LCK07 and LCK10 to LCK17.

Data paths DPA and DPB each, as described above, include: a write driver performing writing of data into a selected memory cell; a preamplifier amplifying data of a selected memory cell; and a data input-output buffer performing supply/reception of external data, and perform supply/reception of internal data to/from a memory cell on a column selected by column decoder CDA.

By performing row selection in units of memory blocks in banks BA#0 and BA#1 as shown in FIG. 26, non-selected memory blocks can be maintained in a precharge state, thereby achieving reduced current consumption.

An address signal for designating a word line (hereinafter referred to as a word line address signal) needs to be applied commonly to all memory blocks and therefore, applied commonly to local control circuits LCK00 to LCK07 and LCK10 to LCK17.

FIG. 27 is a diagram showing an example of configuration of an input buffer included in main control circuit MCK. In main control circuit MCK, command CMD and address signal ADD externally applied are taken-in in synchronization with external clock signal ECLK (internal clock signal CLK).

In FIG. 27, an input buffer IB includes: an inverter IV inverting clock signal (internal clock signal) CLK; a transmission gate XF1 turning conductive when clock signal CLK is at L level to pass an input signal IN therethrough; an inverter latch IL1 latching a signal passing through transmission gate XF1; a transmission gate XF2 turning conductive when clock signal CLK is at H level to pass a signal latched by inverter latch IL1 therethrough; and an inverter latch IL2 latching a signal passing through transmission gate XF2 to generate internal output signal OUT.

Transmission gates XF1 and XF2 are CMOS transmission gates and are rendered conductive/non-conductive in synchronization with clock signal CLK and a complementary clock signal from inverter IV. Now, description will be given of an operation in input buffer IB shown in FIG. 27 with reference to a signal waveform diagram shown in FIG. 28.

When clock signal CLK is at L level, transmission gate XF1 is in a conductive state and input signal IN is latched by inverter latch IL1. On the other hand, transmission gate XF2 is in a non-conductive state to keep output signal OUT unchanged.

When clock signal CLK rises to H level, transmission gate XF1 enters a non-conductive state and input signal IN exerts no influence on a latch signal of inverter latch IL1. Concurrently with that clock signal CLK rises to H level, transmission gate XF2 enters a conductive state to transmit a signal latched by inverter IL1 to inverter latch IL2 and to generate output signal OUT. Therefore, output signal OUT changes in synchronization with a rise of clock signal. Output signal OUT is maintained in that state during one clock cycle time of clock signal CLK.

Input buffer IB shown in FIG. 27 is provided to each of address signal ADD and command signal CMD in main control circuit MCK. Therefore, since an internal signal is generated in synchronization with a rise of clock signal CLK, the internal signal changes in synchronization with a rise of clock signal CLK if a set-up/hold time relative to clock signal CLK is secured, and therefore, no consideration is required to be given on a skew between input signals, thereby enabling an internal operation start timing to be faster.

FIG. 29 is a diagram schematically illustrating interconnection line loads of an internal clock signal, a row-related control signal and a predecode block address. In FIG. 29, internal clock CLK is transmitted through a signal line SGL0 by a clock driver DRV0. Row-related control signal BR (BR0 or BR1) is transmitted through a signal line SGL1 by drive circuit DRV1. Predecoded block address signal PB is transmitted through a signal line SGL2 by a drive circuit DRV2.

Internal clock signal CLK, as shown in FIG. 26, is required to be applied commonly to local control circuits LCK00 to LCK07, and LCK10 to LCK17, which makes a load capacitance C0 of signal line SGL0 the largest.

As for row-related control signal BR, since all the local control circuits of a corresponding bank are coupled thereto, a load capacitance C1 of signal line SGL1 becomes a second largest.

As for predecode block address bit group PBG1 of predecode block address signal PBA, local control circuits only for two memory blocks are connected thereto in each bank, which makes a load capacitance of the signal line SGL2 the smallest. As for predecode block address bit group PBG0, only 4 local control circuits are connected thereto in each bank. Therefore, by providing a repeater between banks, a load on driver DRV2 is alleviated and the interconnection load thereon can be reduced to be smaller than that of a row-related control signal.

Since interconnection capacitances C0 to C2 on signal lines SGL0 to SGL2 are different from each other, signal propagation delays are different to thereby cause a skew between signals. Particularly, since the signals are transmitted toward a local control circuit LCK17 located remotely from main control circuit MCR in one-way direction along a column direction, signal propagation times are different between nearest local control circuit LCL00 and farthest local control circuit LCK 17 with respect to main control circuit MCK, and the magnitude of the skew corresponding differ between them.

FIG. 30 is a diagram showing a timing relationship between input signals to local control circuit LCK00 and LCK17, and external clock signal ECLK, address signal ADD and command CMD schematically.

Main signal circuit MCK is supplied with external cock signal ECLK, address signal ADD and command CMD. Address signal ADD and command CMD externally applied are taken-in in synchronization with a rise of external clock ECLK, to generate predecode block address signals PBA and row-related control signals BR (BR0 or BR1).

Local control circuit LCK00 located nearest to main control circuit MCK has the smallest phase difference between internal clock CLK and external clock ECLK. In main control circuit MCK, row-related control signal BR0 and predecode block address signal PBA are generated in synchronization with internal clock CLK and transmitted to local control circuit LCK00.

To local control circuit LCK00, internal clock signal CLK reaches a little behind predecode block address signal PBA and row-related signal BR0 since a interconnection capacitance C0 of signal line SGL0 through which internal clock signal CLK is transmitted is larger. In this case, however, a skew between predecode block address signal PBA and internal clock signal CLK is smaller since lengths of interconnection lines for the signals are short. When local control circuit LCK00 operates in synchronization with internal clock CLK under this timing condition, a set-up time for predecode block address signal PBA is insufficient, and therefore, there is a possibility of occurrence of a malfunction.

For local control circuit LCK17 located at the farthest from main control circuit MCK, on the other hand, a propagation time of internal clock signal CLK is the largest because of a long interconnection length. While propagation times of row-related control signal BR1 and predecode block address signal PBA are also larger as compared with a propagation time for local control circuit LCK00, the propagation times are smaller compared with a delay time of internal clock signal CLK. In this case, a phase difference between predecode block address signal PBA and internal clock signal CLK, that is, a skew, becomes large. Therefore, in local control circuit LCK17, an internal operation start timing cannot be faster, thereby hindering a high speed operation.

If an operation start timing in a local control circuit is set according to a distance from main control circuit MCK, an operation start timing becomes different in each local control circuit from others, resulting in a complicated circuit design. Furthermore, with a faster external clock ECLK, a timing adjustment time therefor becomes shorter, causing timing adjustment to be extremely difficult. Accordingly, an operation timing of an internal circuit needs to be set according to the worst skew condition for local control circuit LCK located at the farthest from main control circuit MCR, leading to a problem that a high speed operation is hindered.

Furthermore, in predecode block address signal PBA as well, predecode block address signal bit group PBG0 and predecode block address bit group PBG1 are different in interconnection load from each other, causing a difference in delay time. Therefore, timings at which predecode block address signal bits all becomes a definite state are different in local control circuits from each other, thereby causing a case where a correct decoding operation is not performed.

FIG. 31 is a diagram schematically showing a configuration of main control circuit MCK. In FIG. 31, main control circuit MCK includes: a clock buffer 900 receiving external clock ECLK to generate internal clock CLK; a command input buffer 902 taking in a command CMD externally applied in synchronization with internal clock signal CLK from clock buffer 900; a row address input buffer 904 taking in address signal ADD externally applied in synchronization with internal clock CLK; a row-related control signal generating circuit 905 decoding command CMD from command input buffer 902 in synchronization with internal clock signal CLK to generate row-related control signal BR0 for bank BA#0 according to a result of decoding; a row-related control signal generating circuit 906 decoding command CMD from command input buffer 902 in synchronization with internal clock signal CLK to generate row-related control signal BR1 for bank BA#1 according to a result of decoding; and a column-related control circuit 908 decoding command CMD from command input buffer 902 in synchronization with internal clock CLK to control operations in circuitry related to a data access (column selection and data input/output).

Bank address BAD from row address input buffer 904 is applied to row-related control signal generating circuits 905 and 906, and a row-related control signal generating circuit provided to a bank designated by the bank address BAD is activated. Row-related control signal BR0 for bank BA#0 includes: a row address decode enable signal RADE<00>, a word line drive timing signal RXT<0>, a bit line isolation instructing signal BLI<0>, a bit line equalize instructing signal BLEQ<0>, and sense amplifier activating signals SON<0> and SOP<0>. Likewise, row-related control signal BR1 for bank BA#1 includes: signals RADE<1>, RXT<1>, BLI<1>, BLEQ<1>, SON<1> and SOP<1>.

In FIG. 31, column-related control circuit 908 is shown controlling a data path DP performing input/output of data. However, an operation of column decoders provided to banks BA#0 and BA#1 are also controlled by column-related control circuit 908.

In main control circuit MCK, as shown in FIG. 31, there are provided row-related control signal generating circuits 905 and 906 corresponding to the respective banks BA#0 and BA#1. Therefore, with increase in the number of banks, the number of row-related control signal generating circuits needs increasing and in response, a need arises for modifying a layout of row-related control signal generating circuits in main control circuit MCK. For this reason, main control circuit MCK needs to be redesigned according to a bank configuration. Moreover, in a case where loads of signal lines are changed in the redesign, a redesign for adjusting a skew among signals is further required. Accordingly, there arises a problem that it is difficult to adapt to a change in bank configuration. Furthermore, with increase in the number of banks, the number of row-related control signal generating circuits increases, and in response, the number of signal lines transmitting row-related control signals increases to cause not only increase in interconnection region but also increase in circuit occupation area, thereby causing a problem of an increased chip size.

Row-related control signal generating circuits each generate row-related control signals in a prescribed sequence in synchronization with clock signal CLK. When clock signal CLK is of high speed, a pulse width of a control signal generated internally is determined by a cycle time of clock signal CLK. When an internal control signal is generated as a pulse signal, the signal has an H level period and an L level period. In order to generate a pulse signal of a correct waveform, it is necessary to secure an H level period and L level of the pulse signal.

In a case where a main control signal is transferred to local control circuits through bus drive circuits as shown in FIG. 29, a rise time and fall time of a main control signal are determined by operating characteristics of a bus driver and load capacitance of the bus. Therefore, when local control signals are generated utilizing a rise and fall of the main control signal, an activation timing of a local control signal generated in a local control circuit is determined by a restrictive condition imposed on a pulse width of the main control signal, to cause a case of disabling a high speed operation. Therefore, an internal operation cannot be performed according to a high speed clock signal, thereby causing a problem of disabling a data access in synchronization with a high speed clock signal.

SUMMARY OF THE INVENTION

It is an object of the present invention to provide a semiconductor integrated circuit device capable of correctly operating in synchronization with a high speed clock signal.

It is another object of the present invention to provide a semiconductor integrated circuit device capable of performing a selecting operation of a memory cell at a high speed in synchronization with a high speed clock signal, without an influence of a skew among signals.

It is still another object of the present invention to provide a semiconductor integrated circuit device capable of correctly operating according to a high speed clock signal while being easily adapting to a change in bank configuration.

It is yet another object of the present invention to provide a semiconductor integrated circuit device capable of correctly activating/deactivating a plurality of internal memory cell select operation control signals in a prescribed sequence at short intervals.

It is a further object of the present invention to provide a semiconductor integrated circuit device capable of correctly generating a local control signal without suffering a restraint on a pulse width of a main control signal.

A semiconductor integrated circuit device according to a first aspect of the present invention includes: a main control signal generating circuit generating a plurality of control signals having different phases from each other according to an operating mode instructing signal externally applied. The main control signal generating circuit activates one of plural sets of main control signals in a prescribed sequence according to the operating mode instructing signal. The plural sets of main control signals are selected in a prescribed sequence.

The semiconductor integrated circuit device according to the first aspect of the present invention further includes: a local control signal generating circuit generating local control signals in accordance with main control signals from the main control signal generating circuit. The local control signal generating circuit receives main control signals of sets different from each other, to generate local control signals in response to different directions of changes of main control signals of different sets.

A semiconductor integrated circuit according to a second aspect of the present invention includes: a plurality of local circuits each performing a designated operation when active; and a main control signal generating circuit provided commonly to the plurality of local circuits to generate a plurality of control signals having different phases from each other in accordance with an operating mode instructing signal externally applied. The main control signal generating circuit drives plural sets of main control signals at a prescribed sequence in accordance with the operating mode instructing signal.

The semiconductor integrated circuit device according to the second aspect of the present invention further includes: local control circuits provided corresponding to the respective local circuits and generating local operation control signals for the corresponding local circuits in accordance with main control signals from the main control signal generating circuit. The local control circuit receives main control signals of sets different in phase from each other to generate local control signals in response to different directions of changes of main control signals of different sets. The main control signal generating circuit drives one of the plural sets each including a plurality of main control signals to a selected state in a prescribed sequence in accordance with an operating mode instructing signal.

Plural sets of main control signals are activated in units of sets in accordance with an operation mode instructing signal, and local control signals are generated in accordance with change in main control signals in different sets of main control signals. Main control signals can be generated to be transmitted to the local control circuits with the pulse width of the main control signals sufficiently secured. Specifically main control signals in different sets are utilized to eliminate the need of changing the main control signals in each set at high speed, and an internal operation would not be rate-determined by the changing rate of the main control signals in each set. Thus, local control signals can be generated at high speed to speed up an internal operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram more specifically showing a configuration of a part of the semiconductor integrated circuit device according to a first embodiment of the invention;

FIGS. 10A to 10C are diagrams showing a configuration of an ACT counter shown in FIG. 8;

DESCRIPTION OF THE PREFERRED EMBODIMENTS

First Embodiment

Figure 1:
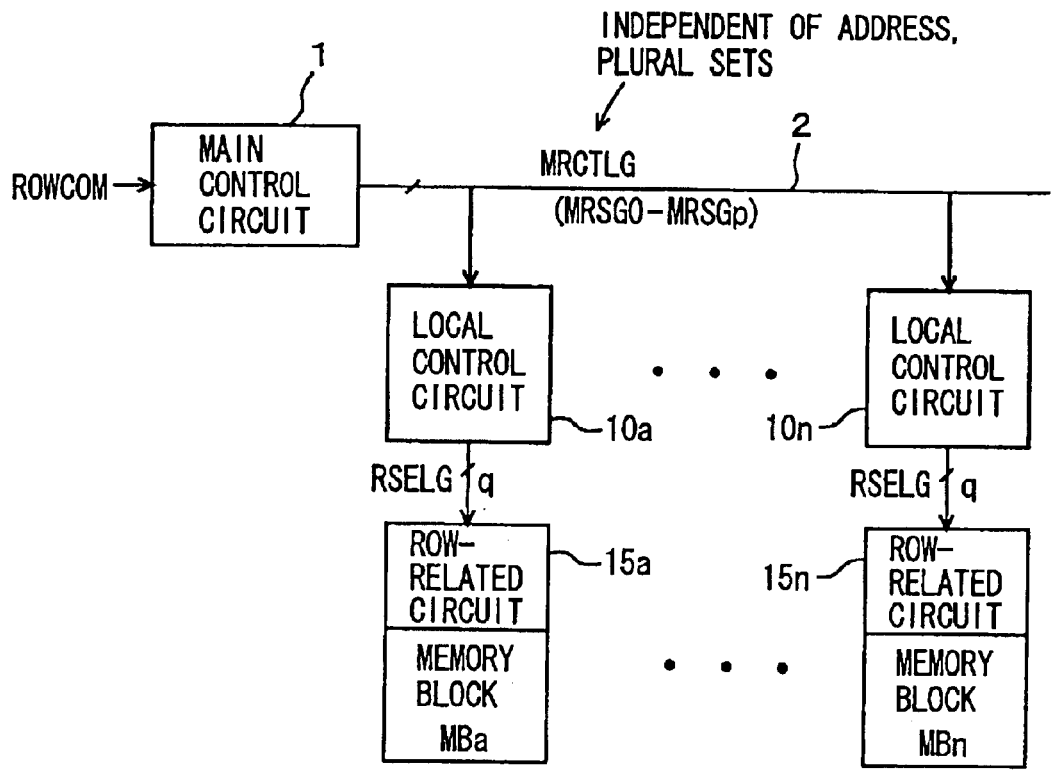
FIG. 1 is a diagram schematically showing a configuration of a main part of a semiconductor integrated circuit according to the present invention.

FIG. 1 is a diagram schematically showing a configuration of a main part of a semiconductor integrated circuit according to a first embodiment of the present invention. Row-related circuits 15a to 15n are provided to memory blocks MBa to MBn, respectively. Each of row-related circuits 15a to 15n includes a sense amplifying circuit, a bit line isolating circuit, a bit line precharge/equalize circuit and others. That is, row-related circuits 15a to 15n perform operations related to row selection in a corresponding memory block MBa to MBn when activated, and maintain corresponding memory blocks MBa to MBn at a precharge state when inactive.

Local control circuits 10a to 10n are provided corresponding to the respective row-related circuits 15a to 15n. Each of local control circuits 10a to 10n is activated according to a block select signal not shown and generates, when active, local row control signal group RSELG for a corresponding one of row-related circuits 15a to 15n. Local row control signal groups RSELG includes q row control signals. Description will be given of details of row control signals included in local row control signal group RSELG later.

Main control circuit 1 is provided commonly to local control circuits 10a to 10n. When a row-related command ROWCOM is applied, main control circuit 1 generates a main row control signal group MRCKLG including a plurality of signals different in phase from each other for transmission through a control signal bus 2. Main row control signal group MRCKLG includes plural sets MRSG0 to MRSGp of main control signals. Main row control signal group MRCKLG is signals independent of an address signal and one of sets MRSG0 to MRSGp of main control signals is selected and main control signals included in the selected set are activated in a prescribed sequence when row-related command ROWCOM is applied. Main control signals of other set are deactivated according to activation of the main control signals of the selected set.

Local control circuits 10a to 10n generate local row control signal RSELG according to a set of main control signals having a prescribed relation in plural sets MRSG0 to MRSGp of main control signals. A rise and fall of corresponding main control signals of different sets of main control signals are utilized when a local row control signal is generated. There is no need to change the main control signals at high speed as far as one set of main control signals is concerned. Thus, a local row control signal can be generated according to a high speed clock signal without suffering a restraint on a pulse width of the main control signals.

Furthermore, sets MRSG0 to MRSGp of main control signals are sequentially selected in a prescribed sequence to activate main control signals included in the selected set. The main control signals are control signals independent of an address signal. Therefore, even with increase in the number of banks, there arises no need to change the configuration of a main row activation signal generating circuit, to enable adaptation to change in bank configuration with ease.

Figure 2:
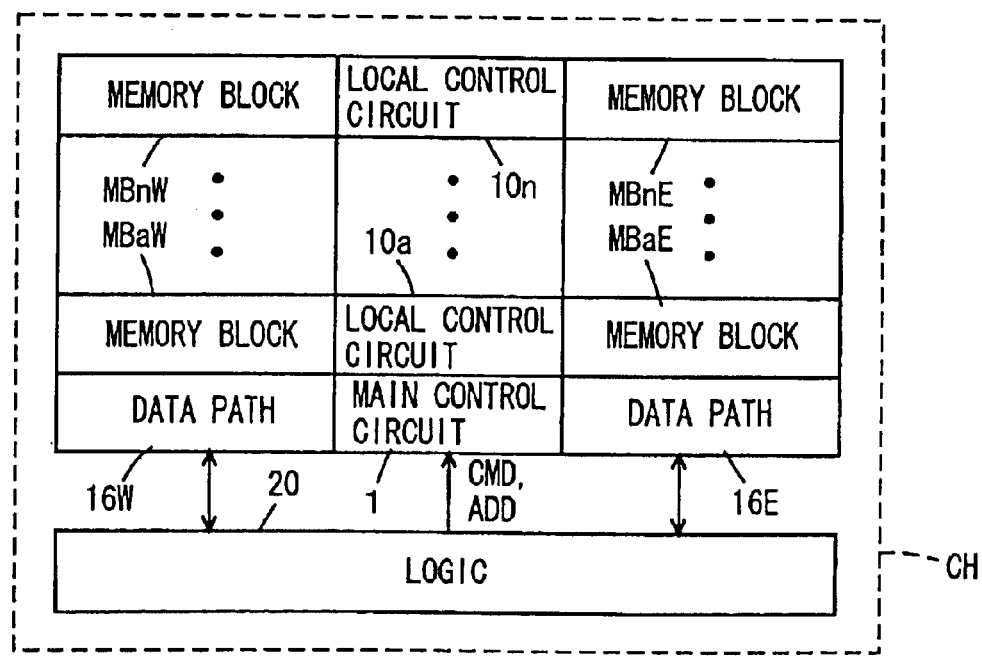
FIG. 2 is a diagram schematically showing an overall construction of a semiconductor integrated circuit device according to a first embodiment of the present invention.

FIG. 2 is a diagram schematically showing an overall construction of a semiconductor integrated circuit device according to the first embodiment of the present invention schematically. Referring to FIG. 2, in a semiconductor integrated circuit device CH, a semiconductor memory device is integrated together with a logic 20 on the same semiconductor chip. Logic 20 performs a prescribed processing and in addition makes a data access to the semiconductor memory device.

The semiconductor memory device includes: a plurality of memory blocks MBaW to MBnW and MBaE to MBnE;

local control circuits 10a to 10n provided corresponding to the respective memory blocks MBaW, MBaE to MBnW, and MBnE; a main control circuit 1 receiving command CMD and address signal ADD from logic 20 to generate main row-related control signals for local control circuits 10a to 10n; a data path 16W provided corresponding to memory blocks MBaW to MBnW; and a data path 16E provided corresponding to memory blocks MBaE to MBnE. Each of data paths 16W and 16E includes: an input buffer of data; an output buffer of data; a write driver generating internal write data; and a preamplifier generating internal read data, and performs supply/reception of data to/from logic 20.

Figure 24:
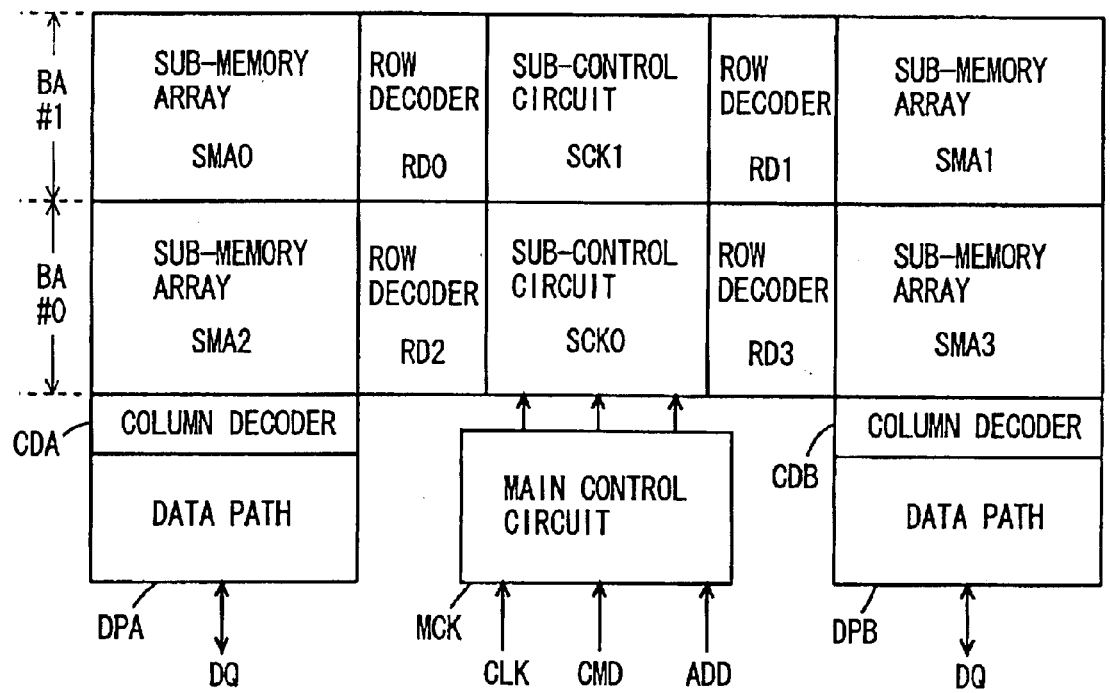
FIG. 24 is a diagram schematically showing an overall construction of a conventional semiconductor memory device.
Figure 25:
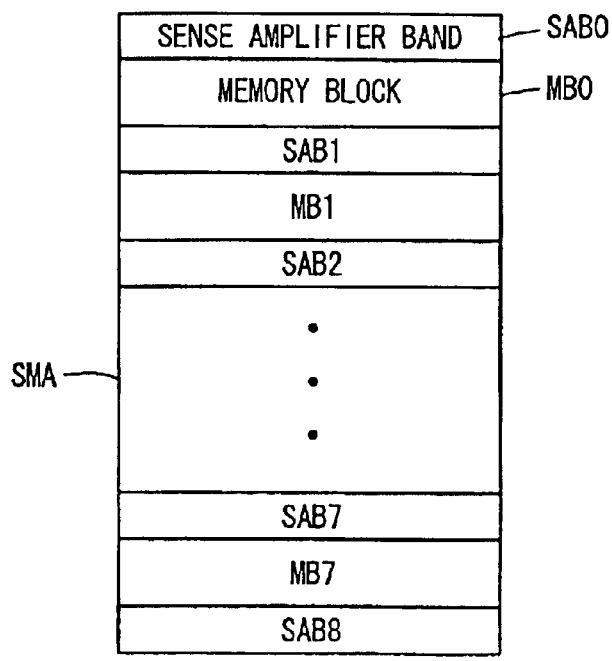
FIG. 25 is a diagram schematically showing a configuration of a sub-memory array shown in FIG. 24.
Figure 26:
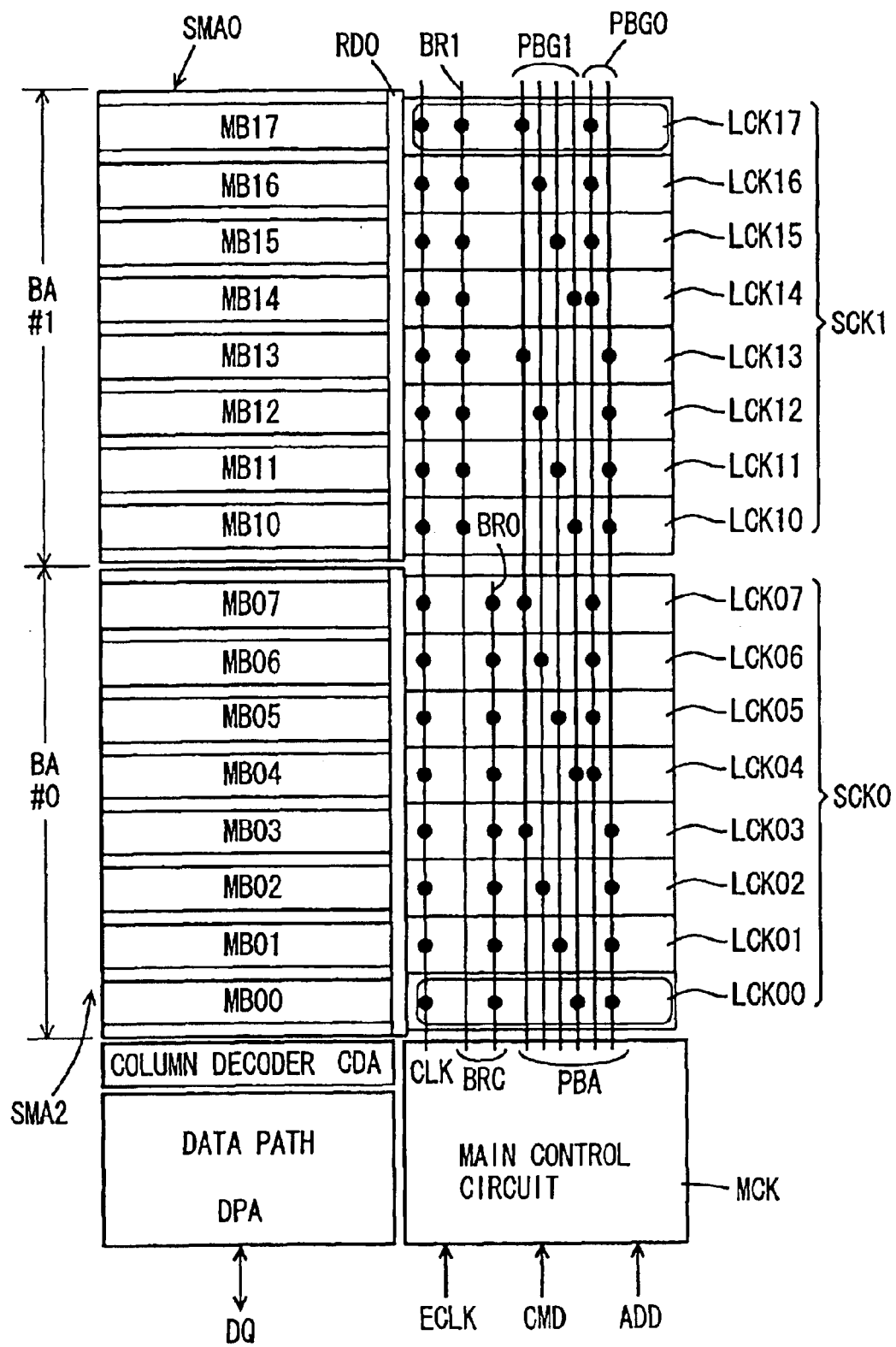
FIG. 26 is a diagram more specifically showing a configuration of the semiconductor integrated circuit device shown in FIG. 24.
Figure 27:
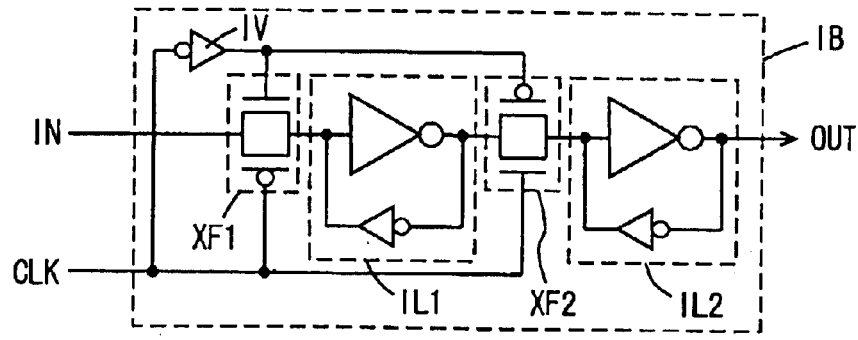
FIG. 27 is a diagram showing an example of configuration of an input buffer included in a local control circuit.
Figure 28:
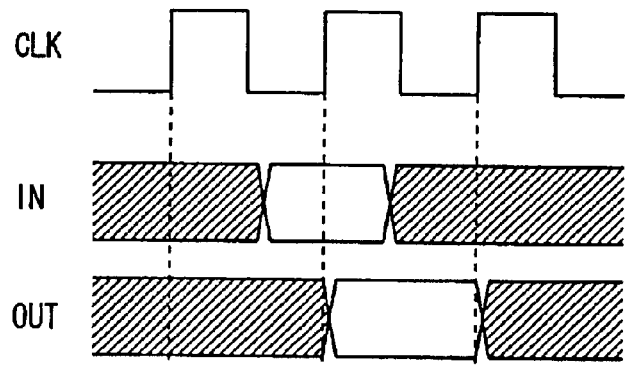
FIG. 28 is a timing diagram representing operations in the input buffer shown in FIG. 27.
Figure 29:
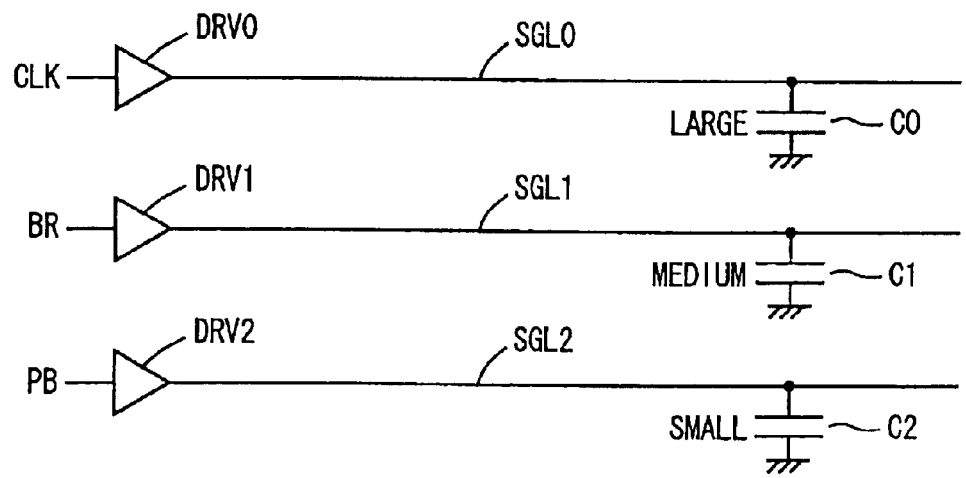
FIG. 29 is a diagram schematically illustrating loads of internal interconnections shown in FIG. 26.
Figure 30:
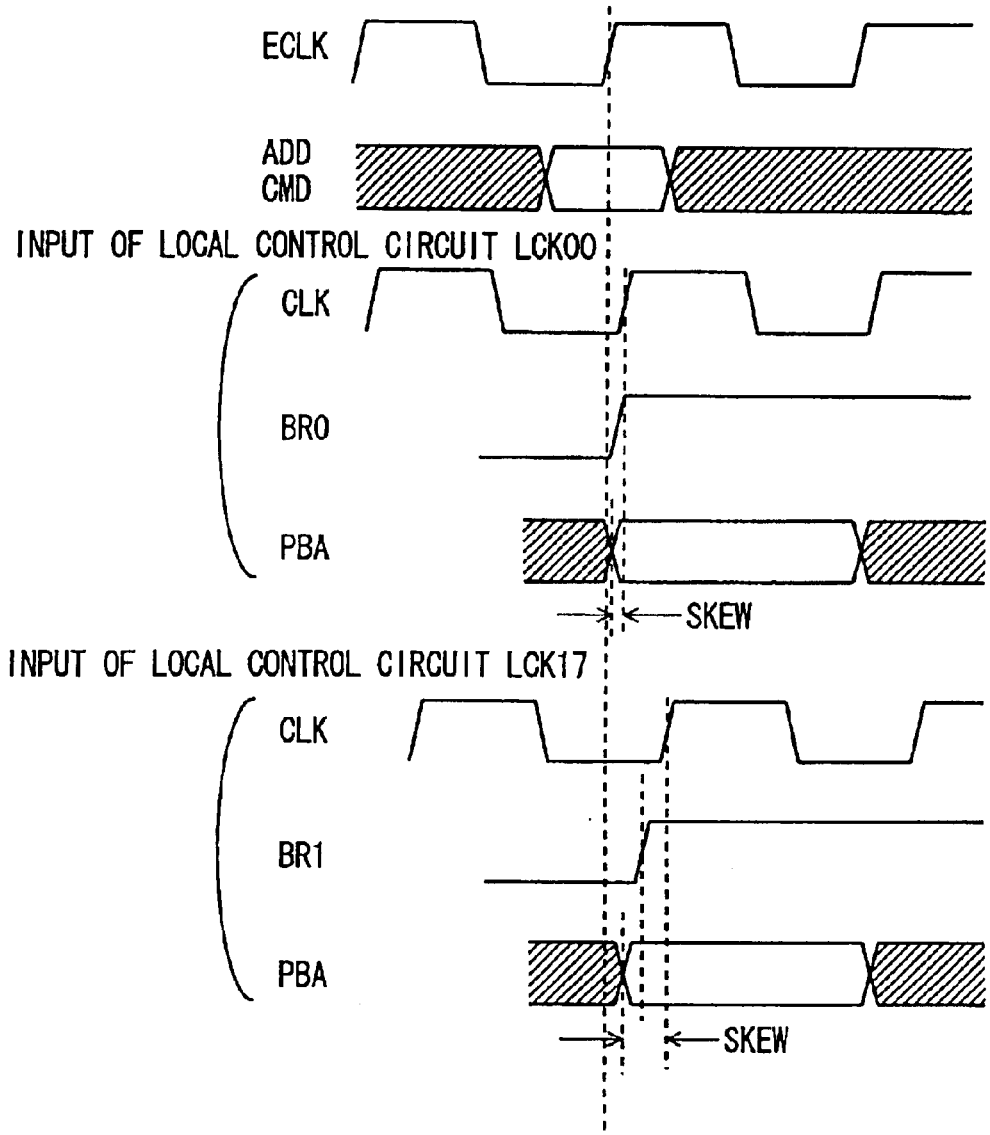
FIG. 30 is a diagram illustrating a signal propagation characteristic of the internal interconnection line shown in FIG. 26.
Figure 31:
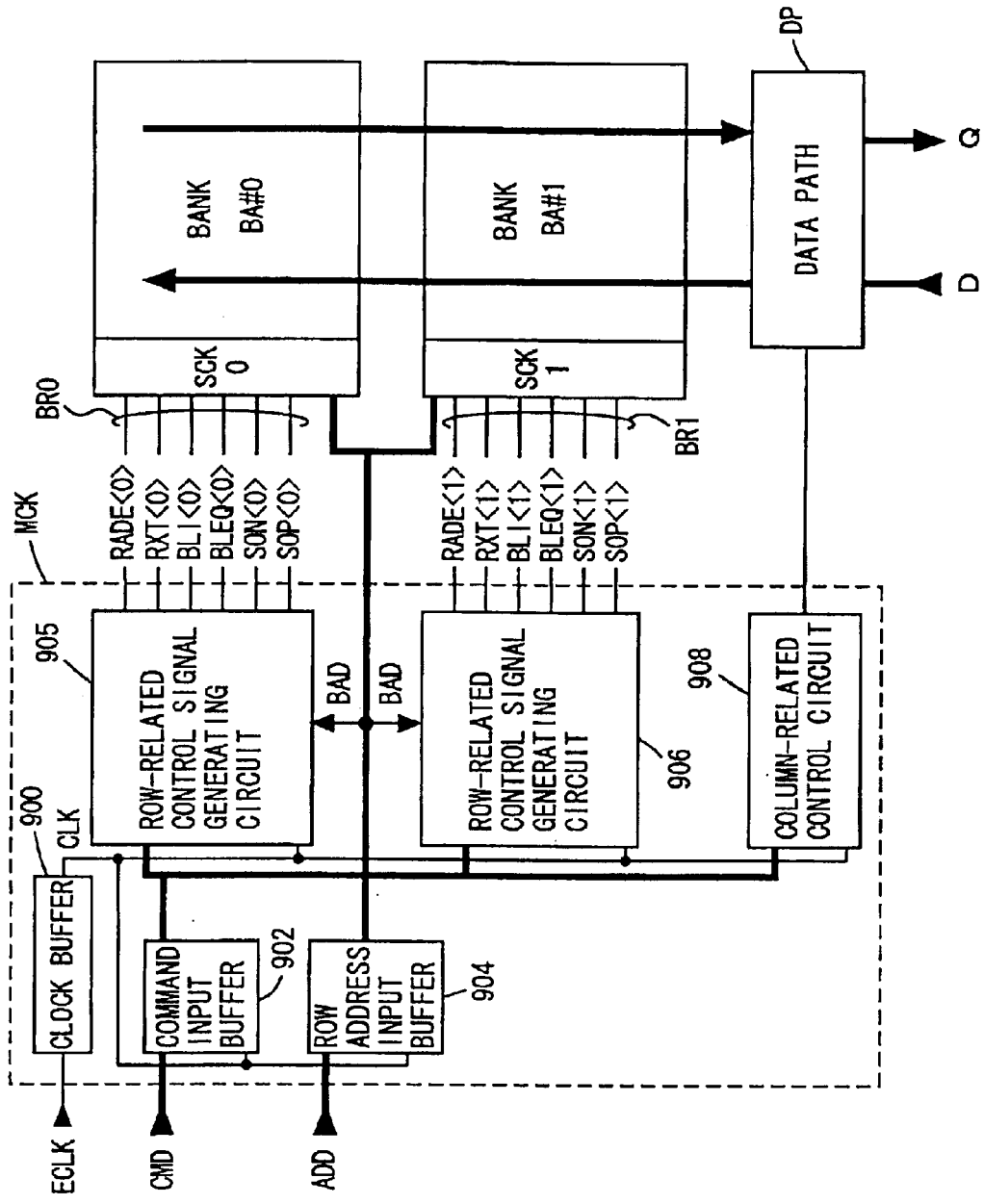
FIG. 31 is a diagram schematically showing another configuration of a conventional semiconductor integrated circuit device.

An overall configuration of the semiconductor memory device itself shown in FIG. 2 is substantially the same as the configuration of the semiconductor memory device shown in FIG. 24. A configuration of row-related control signals transmitted to local control circuits 10a to 10n from main control circuit 1 are different, however, and accordingly, a configuration of each of local control circuits is altered. Description will now be given of a specific configuration.

FIG. 3 is a diagram schematically showing a row-related control circuit section of a main control circuit and a local control circuit. In FIG. 3, main control circuit 1 includes: a clock input buffer 30 receiving clock signal CLK from logic 20 to generate internal clock CLK0; a command decoder 31 taking in and decoding a command CMD received from logic 20 in synchronization with internal clock signal CLK0 from clock input buffer 30 to activate/deactivate row active signal ACT and precharge instructing signal PRC; a clock driver 35 receiving internal clock signal CLK0 from clock input buffer 31 to transmit internal clock CLK1 to local control circuits 10a to 10n; an address input buffer 32 taking in address signal ADD in synchronization with internal clock signal CLK0 to generate internal address signal ADDIN; a main row activation control circuit receiving row active signal ACT from command decoder 31 to generate sets of three-phase main row activating signals, RCNTAA<2:0>, RCNTAB<2:0> and RCNTAC<2:0>; and a main precharge control circuit 34 receiving precharge instructing signal PRC from command decoder 31 in synchronization with internal clock signal CLK0 to generate sets of tow-phase main precharge activating signals, RCNTPA<1:0> and RCNTPB<1:0>.

Three-phase main row activating signals RCNTAA, RCNTAB and RCNTAC are generated by three sets from main row activation control circuit 33. That is, one set of main row activating signals of sets RCNTAA<2:0>, RCNTAB<2:0> and RCNTAC<2:0> is activated according to row active signal ACT.

Likewise, two sets of RCNTPA<1:0> and RCNTPB<1:0> are prepared for the main precharge activating signals from main precharge control circuit 34 and one set of tow-phase main precharge activation signals RCNTPA<i> and RCNTPB<i> is activated/deactivated in a prescribed sequence according to precharge instructing signal PRC from command decoder 31. Each of address input buffer 32, main row activation control circuit 33 and main precharge control circuit 34 has a drive circuit for an output signal thereof. The drive circuits 35 have all the same configuration (the same transistor size) and transmit corresponding signals to local control circuits 10a to 10n with the same driving capability.

Each of local control circuits 10a to 10n has the same configuration and in FIG. 3, there is representatively shown a schematic internal configuration of local control circuit 10i.

Local control circuit 10i includes: a clock input circuit 37a receiving internal clock signal CLK1; an address input circuit 37b receiving internal address signal ADDIN; an input circuit 37b receiving main row activating signals RCNTAA<2:0> to RCNTAC<2:0>; an input circuit 37e receiving main precharge activating signals RCNTPA<1:0> and RCNTPB<1:0>; a block address decoder 40 receiving and decoding a block address signal from address input circuit 37c; and a row-related local control circuit 41 generating row-related control signals BLI, BLEQ, SON, SOP, and RXT, and word line select signal Add in accordance with internal address signal ADDIN, a block select signal from block address decoder 40, the internal clock signal from clock input circuit 37a and output signals of input circuits 37d and 37e.

Input circuits 37a to 37e each include a buffer circuit having the same configuration and have the same input load (an input impedance). Therefore, driving loads on drivers 35a to 35e of main control circuit 1 are all the same and thus interconnection loads of the signals transmitted to local circuits from main control circuit 1 can be made the same for each memory block, enabling skews among signals to be the same for each memory block.

Memory block MBi is provided corresponding to local control circuit 10i. As row-related circuit 15i for memory block MBi, there are provided word line driver 15ia, a sense amplifier 15ib and a bit line load circuit 15ic. Word line driver 15ia drives word line WL corresponding to an addressed row of memory block IBi in accordance with word line select signal Add and word line drive timing signal RXT from row-related local control circuit 41.

Bit line isolating circuit 15ic includes a bit line isolating gate provided corresponding to a bit line pair of memory block MBi and disconnects sense amplifier 15ib from memory block MBi when bit line isolation instructing signal BLi is at L level.

In sense amplifier 15ib, there are provided a sense amplifying circuit provided corresponding to each bit line pair and a bit line precharge/equalize circuit provided corresponding to each bit pair. Bit line equalize instructing signal BLEQ is applied to the bit line equalize/precharge circuit to precharge and equalize each bit line pair at an intermediate voltage. A sense amplifying circuit included in sense amplifier 15ib is activated/deactivated by sense amplifier activating signals SON and SOP.

Figure 4:
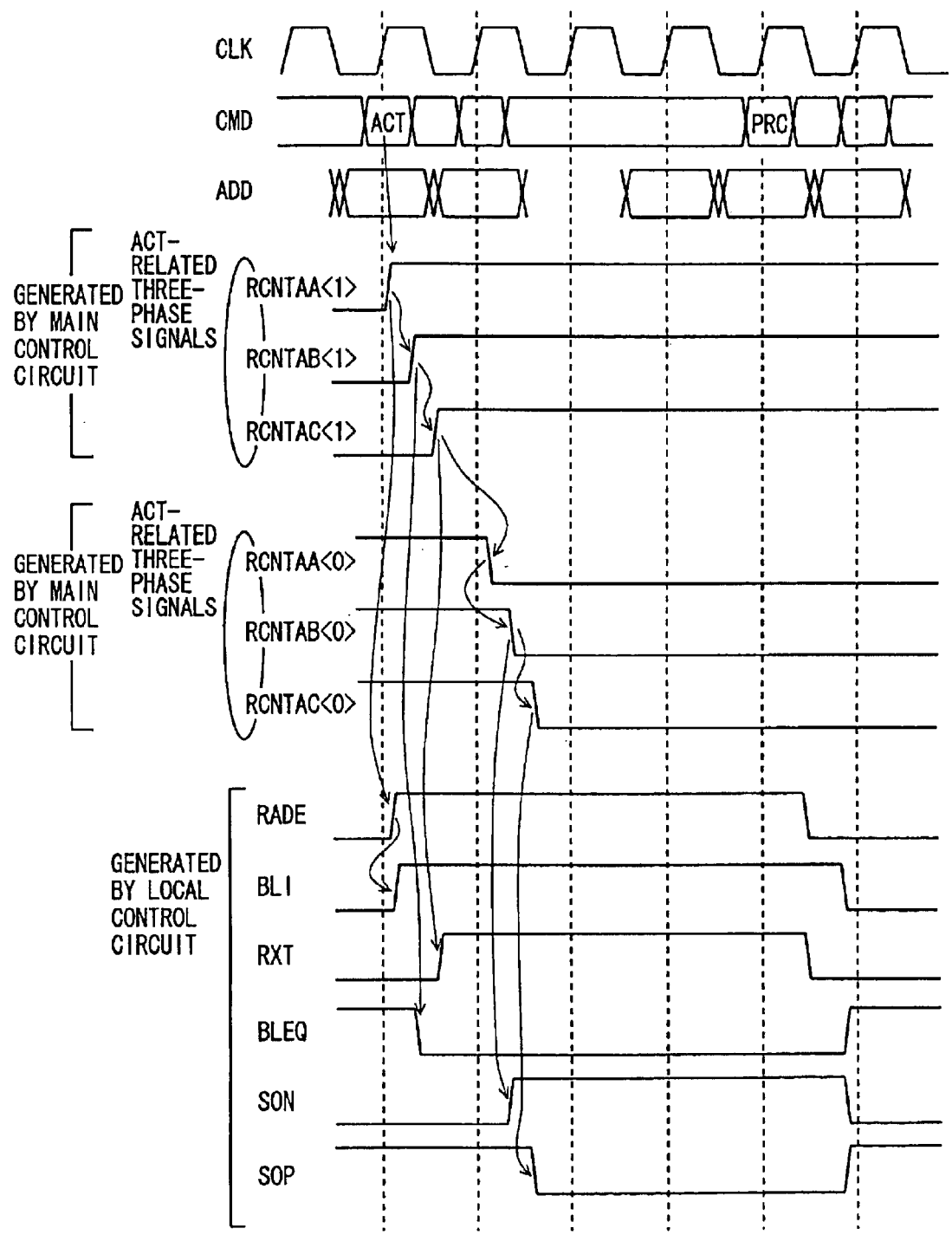
FIG. 4 is a timing diagram representing an operation of a circuit showing in FIG. 3.

Now, description will be given of operations in the main control circuit and local control circuit with reference to a signal waveform diagram shown in FIG. 4.

In main control circuit 1, command decoder 31 takes in command CMD externally applied at a rising edge of internal clock signal CLK0 to generate a signal instructing a operating mode designated by the taken in command. In the case when command CMD is a row active command instructing row selection, command decoder 31 activates row active signal ACT. Row active signal ACT may be a post-decoded operating mode instructing signal from a logic.

Main row activation control circuit 33 sequentially activates main row activating signals of a set in response to row active signal ACT among three sets of main row activating signals RCNTAA<2:0> to RCNTAC<2:0>. In FIG. 4, there is shown a sequence in which main row activating signals RCNTAA<1> to RCNTAC<1> are sequentially activated, as an example. When a set of main row activating signals RCNTAA<1> to RCNTAC<1> is sequentially activated in a prescribed sequence, main row activation control circuit 33, then, sequentially deactivates (drives to L level) a different set of main row activating signals RCNTAA<0> to RCNTAC<0> that have been at H level by that time in response to a rise of main row activating signal RCNTAC<1>.

Therefore, when a row active command is applied, voltage levels of three-phase main row activating signals of one set are sequentially raised from L level to H level (activated). When these main row activating signals of the selected set are all activated, three-phase main row activating signals of a different set previously in a selected state are sequentially lowered to L levels (deactivated). Main row activating signals RCNTAA<2:0> to RCNTAC<2:0> are applied commonly to local control circuits 10a to 10n. Therefore, an H level period of main row activating signals in one set is set to be equal to a cycle at which the active commands are applied twice and an L level period is made equal to a clock cycle period in which the active command is successively applied. Thus, even with a high speed clock signal used, main row activating signals can be generated with a margin.

In local control circuit 10i, block address decoder 40 decodes a block address included in an address signal to generate a block select signal (block hit signal) indicating a decoding result. When a block select signal is active, a corresponding local circuit, that is, a corresponding memory block, is selected, row-related local control circuit 41 operates to sequentially activate local row-related control signals in response to rises in one set of main row activating signals RCNTAA<2:022 to RCNTAC<2:0> and falls in a different set of the main row activating signals. Specifically, row address decode enable signal RADE is activated in response to a rise of main row activating signal RCNTAA<1> to start a decoding operation of row address signal ADDIN. Furthermore, when bit line isolation instructing signal BLI attains H level, a memory block paired with the selected memory block is isolated from a sense amplifier band.

Then, bit line equalize instructing signal BLEQ falls to L level in response to a rise of main row activating signal RCNTAB<1> to cease an equalize/precharge operation on bit lines in a selected memory clock.

Word line drive timing signal RXP is activated in response to a rise of main row activating signal RCNTAC<1>. Word line driver 15ia (see FIG. 3) is activated according to word line drive timing signal RXP and an addressed word line is driven to a selected state according to a word line select signal Add decoded and generated in response to row address decode enable signal RADE.

Then, when main row activating signal RCNTAC<1> rises, main row activating signals RCNTAA<0> to RCNTAC<0> falls sequentially from H level to L level. Sense amplifier activating signal SON rises to H level in response to fall of main row activating signal RCNTAB<0> while sense amplifier activating signal SOP falls to L level in response to fall of main row activating signal RCNTAC<0>. In response, sense amplifier 15ib is activated to perform sensing, amplification and latching of data in a memory cell connected to a selected word line. Row-related control signals RADE, BLI, RXT, BLEQ, SON and SOP maintain the states thereof until a precharge command instructing termination of row selection is subsequently supplied.

When precharge instructing signal PRC is applied, initialization is performed according to tow-phase main precharge control signals RCNTPA<1:0> and RCNTPB<1:0>. In FIG. 4, there are shown operations related to main row activating signals RCNTAA and RCNTAC without showing main precharge instructing signals RCNTPA and RCNTPB related to the precharging, for the sake of simplification of the drawing.

In a row-related local control circuit, row-related circuits can generate necessary more local row-related operation control signals with combination of the phases of three-phase main control signals.

The following advantage can be provided by changing row-related control signals utilizing rising edges and falling edges of main control signals of a different set of main row activating signals.

Figure 5:
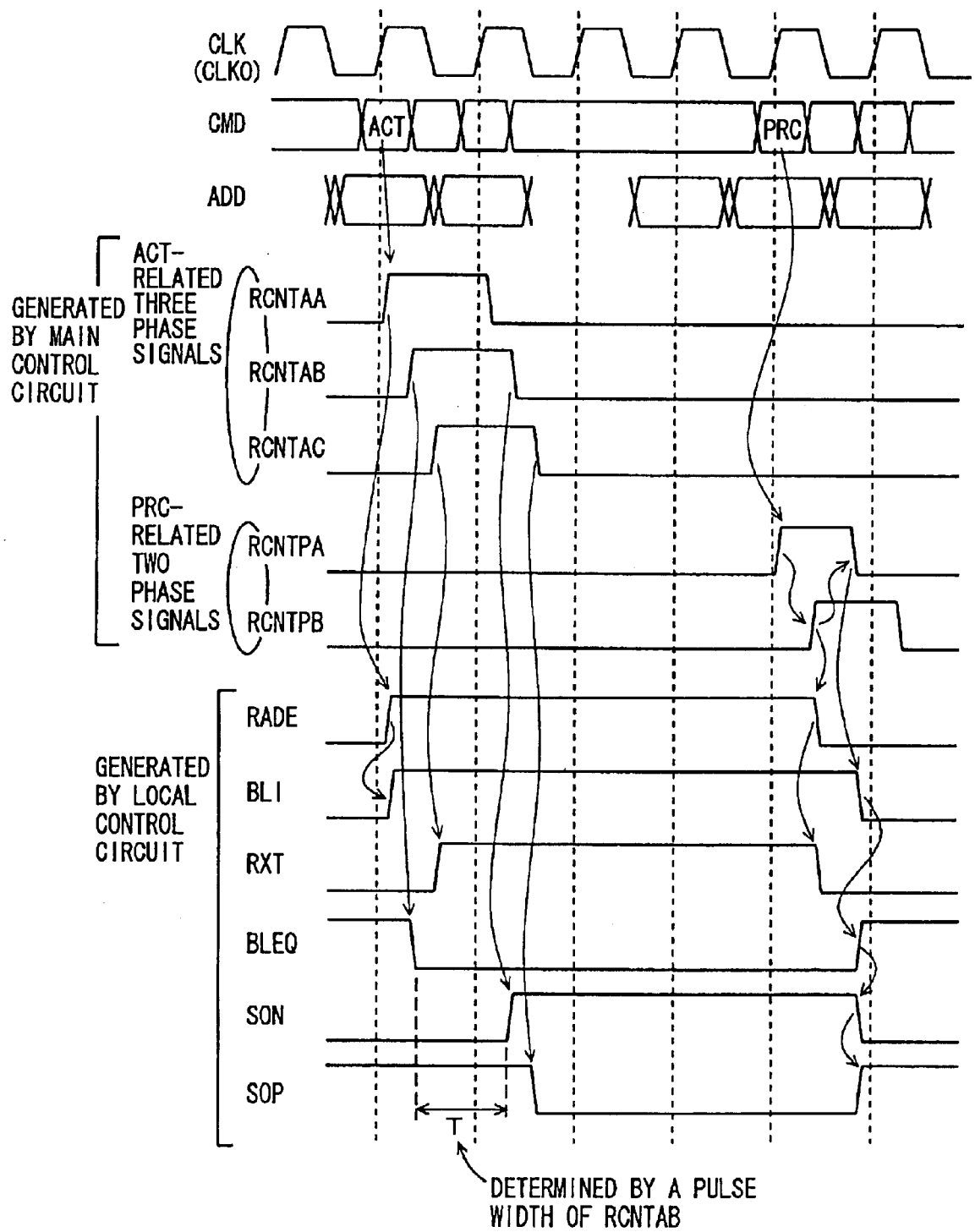
FIG. 5 is a diagram representing operations in the circuit shown in FIG. 3 when one set of main control signals is used.

FIG. 5 is a signal waveform diagram representing operations in the case when one set of main row-related control signals is used. In an operation sequence shown in FIG. 5, there are used one set of main row activating signals RCNTAA to RCNTAC and one set of main precharge activating signals RCNTPA and RCNTPB. Activation/deactivation of a local row-related control signal is performed with a rising edge and falling edge of main row activating signal RCNTAA being as a triggering and initialization of local row control signals is performed utilizing the rising edges and falling edges of main precharge activating signals RCNTPA and RCNTPB.

In FIG. 5, for example, row address decode enable signal RADE and bit line isolation instructing signal BLI rise to H level in response to a rise of main row activating signal RCNTAA. Bit line equalize instructing signal BLEQ falls to L level in response to a rising edge of main row activating signal RCNTAB. Then, sense amplifier activating signal SON rises to H level into activation in response to a fall of main row activating signal RCNTAB.

Furthermore, word line drive timing signal RXP rises to H level in response to a rise of main row activating signal RCNTAC and sense amplifier activating signal SOP falls to L level in response to main row activating signal RCNTAC to activate P sense amplifier (a sense amplifying circuit section constituted of P-channel MOS transistors).

When precharge instructing signal PRG is activated, row address decode enable signal RADE and word line drive timing RXT fall to L level in response to a rise of precharge activating signal RCNTPB. Subsequently, main precharge activating signal RCNTPA falls in response to a rise of precharge activating signal RCNTPB and in response, bit line isolation instructing signal BLI falls to L level while bit line equalize instructing signal BLEQ rises to H level. Then, sense amplifier activating signal SON is driven to L level and sense amplifier activating signal SOP is driven to H level.

In the case where one set of main control signals are used as described above, for example, a bit line equalize operation is completed in response to a rise of main row activating signal RCNTAB, and subsequently, sense amplifier activating signal SON is activated in response to a fall of main row activating signal RCNTAB. Therefore, a time T between completion of a bit line precharge operation internally and activation of a sense amplifier (N sense amplifier: a sense amplifier constituted of N-channel MOS transistors) for performing a sensing operation is determined by a period while main row activating signal RCNTAB is at H level. The minimum value of time T is determined by a rise time tr and fall time tf of main row activating signal RCNTAB.

Figure 6:
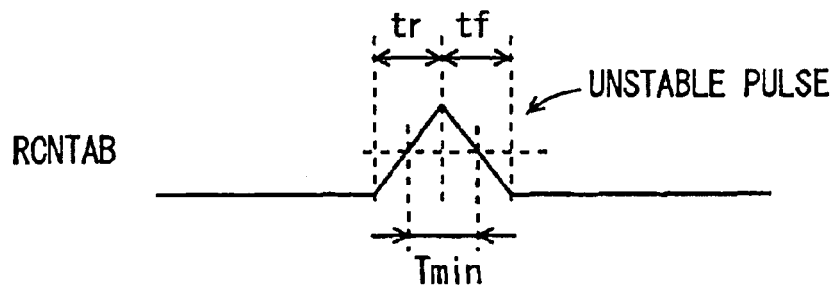
FIG. 6 is a diagram showing the minimum pulse width of a main row activating signal shown in FIG. 5.

An inverter is provided at the first stage of input circuit 37d. When an input logic threshold voltage of the inverter is assumed to be, for example, VDD/2, an output signal of the inverter changes when the input signal exceeds the input logic threshold voltage, and therefore, the time T cannot made shorter than (tr+tf)/2 as shown in FIG. 6. Rise time tr and fall time tf are determined by a circuit configuration and a load on a bus, and cannot be made shorter than a prescribed time. If a pulse signal is changed in the minimum time, an H level period cannot be secured, and the pulse signal could not generated correctly. In order to correctly generate a pulse signal, the signal needs to be changed with an H level time and an L level time secured. Therefore, in a case in which a rise and fall of main control signal are utilized, the time T cannot be reduced due to a restraint on a pulse width of a main control signal. Thus, there is caused a possibility that it would be difficult to internally perform selection and non-selection of a row in synchronization with a high speed clock.

By utilizing plural sets of main control signals, however, a main control signal has only to be slowly changed in each set and a pulse width can be sufficiently secured. Thus, a local row-related control signal can be changed without suffering a restraint on a pulse width of a main control signal.

In other words, by utilizing different sets of main control signals and employing different edges of the respective sets, a sufficient pulse width of a main control signal can be secured when generating a local row control signal. Moreover, a rising edge and a falling edge of different control signals are utilized. Therefore, even when main control signals are sequentially changed at extremely short intervals in each set, main control signals change only in one direction in each set. A sufficient H level period and a sufficient L period can be accordingly secured for each of main control signals, and a local row-related control signal can be driven into a desired state according to an edge of a main control signal.

Particularly, by utilizing three or more sets of main control signals, an H level period and an L level period of a main row-related control signal (main row activating signal and main precharge activating signal) can be secured over a period of 1 cycle even if an active command is applied to each clock cycle. Thus, a main row-related activating signal can be generated having a correct waveform and a local row-related control signal can be stably changed using this edge as a triggering to ensure a high speed operation.

Figure 7:
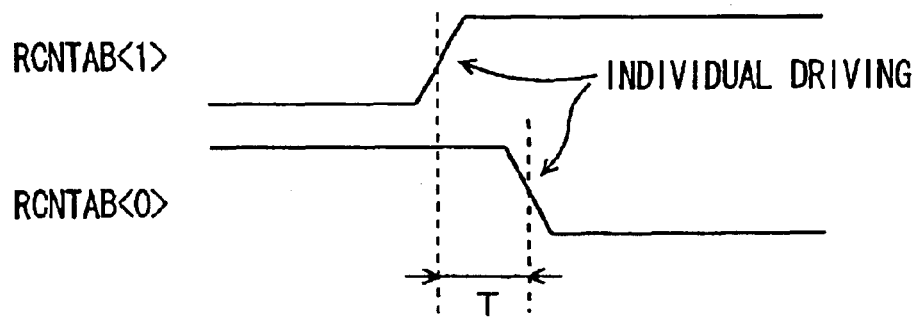
FIG. 7 is a diagram illustrating a phase relationship between main row activating signals according to the first embodiment of the present invention.

As an example, if one main row activating signal RCNTAB is used as shown in FIG. 6, the minimum time Tmin of the time T until the start of a sensing operation is determined by a rise time tr and fall time tf of main row activating signal RCNTAB. If main row activating signal RCNTAB, as shown in FIG. 6, is raised and immediately thereafter lowered, however, a signal waveform becomes unstable, and a correct operation can not ensured. In addition, extreme difficulty is encountered in timing control for lowering a main row activating signal RCNTAB immediately after raising the signal. By utilizing main row activating signals RCNTAB<1:0> of different sets as shown in FIG. 7 to employ a rising edge and falling edge of the respective signals, however, an H level period and an L level period of each of main row activating signals RCNTAB<1:0> are sufficiently secured, thereby allowing the time T between the rising edge and the falling edge to be set to a desired value. Hence, an internal operation can be correctly ensured. The minimum value of the time T shown in FIG. 7 can be adjusted through the delay time of a delay circuit in main control circuit and no interconnection delay is required to be considered, thereby enabling the time T to be set correctly.

Figure 8:
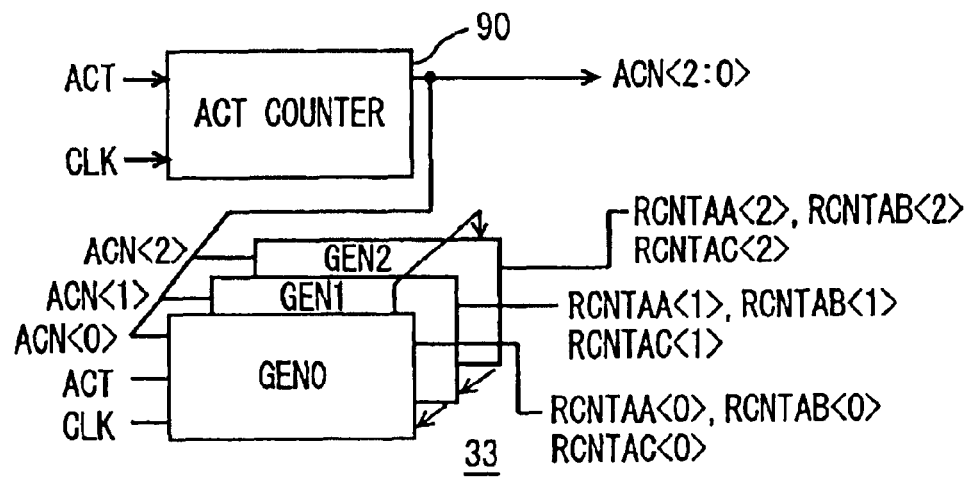
FIG. 8 is a diagram showing a configuration of a main control signal generating circuit shown in FIG. 3 schematically.

FIG. 8 is a diagram showing a configuration of main row activation control circuit 33 shown in FIG. 3 schematically. In FIG. 8, main row activation control circuit 33 includes: an ACT counter 90 counting active command (active instruction signal) ACT in response to a rise of clock signal CLK (CLK0); and a main row activation signal generating circuits GEN2 to GEN0 selectively enabled in response to a count value ACN<2:0> of ACT counter 90, to generate main row-related control signals RCNTAA<2> to RCNTAC<2>, RCNTAA<1> to RCNTAC<1> and RCNTAA<0> to RCN-TAC<0> according to clock signal CLK and active instruction signal ACT.

Main row activating signal generation circuits GEN2 to GEN0 each reset a main row activation signal generating circuit at the preceding stage in a prescribed sequence when a main row activating signal generated by one main row activation signal generating circuit is active. In FIG. 8, there is shown, as an example, a sequence in which main row activation signal generating circuits GEN2 to GEN0 deactivate main row activation signal generating circuits GEN1, GEN0 and GEN2 at the respective preceding stages.

ACT counter 90 updates its count bits ACN<2:0> when active instruction signal ACT is applied at a rise of clock signal CLK (CLK0). Main row activation signal generating circuits GEN2 to GEN0 are enabled according to count bits ACN<2> to ACN<0> to activate corresponding main row activating signals in a prescribed sequence according to clock signal CLK (CLK0) and active instruction signal ACT.

Figure 9:
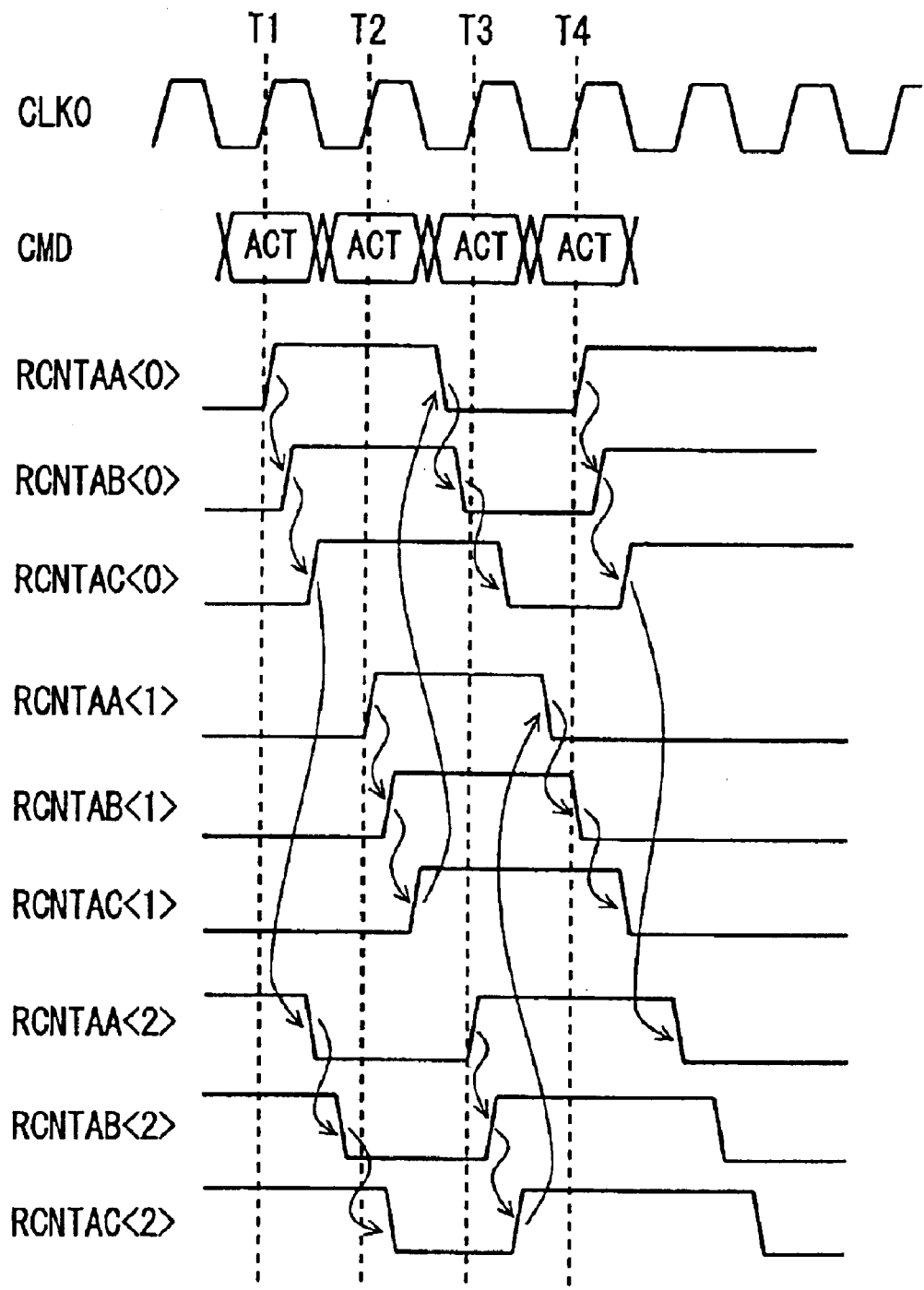
FIG. 9 is a timing diagram representing operations in the main control signal generating circuit shown in FIG. 8.

FIG. 9 is a diagram representing operations in main row activation control circuit 33 shown in FIG. 8. In FIG. 9, row active command ACT is directly applied externally. In other words, in this configuration, command decoder 31 shown in FIG. 3 is not provided. A logic on the same chip decodes a command of an array activation instructing signal to supply active instruction signal ACT as command CMD. Hereinafter, the active instruction signal is referred to as row active command ACT in the description.

When row active command ACT is applied at time T1, one set of main row activation signal generating circuit is activated. In FIG. 9, main row activation signal generating circuit GEN0 is activated and main row activating signals RCNTAA<0> to RCNTAC<0> are sequentially activated (raised to H level).

On the other hand, when main row activating signal RCNTAC<0> rises to H level, main row activation signals RCNTAA<2> to RCNTAC<2> in an active state outputted by main row activation signal generating circuit GEN2 are sequentially deactivated.

Row active command ACT for another bank is applied at time T2 during which main row activating signal RCN-TAA<0> is active. ACT counter 90 performs a counting operation according to the row active command ACT to activate another main row activation signal generating circuit GEN1. Main row activation signal generating circuit GEN1 sequentially activates main row activating signals RCNTAA<1> to RCNTAC<1> according to row active command ACT applied at time T2.

When main row activating signal RCNTAC<1> is activated, main row activating signals RCNTAA<0> to RCNTAC<0> are sequentially deactivated.

When row active command ACT is again applied at time T3, the other main row activation signal generating circuit GEN2 is activated, and main row activating signals RCN-TAA<2> to RCNTAC<2> are sequentially activated according to row active command ACT at the time T3. When main row activating signal RCNTAC<2> is activated, main row activation signal generating circuit GEN1 is reset to sequentially deactivate main row activating signals RCNTAA<1> to RCNTAC<1>.

When row active command ACT is again applied at time T4, the first main row activation signal generating circuit GEN0 recovered to a standby state is again activated and main row activating signals RCNTAA<0> to RCNTAC<0> are sequentially activated according to row active command ACT at time T4.

In each cycle, internal operation control signals are generated utilizing rising edges of main row activating signals of an activated set of main row activating signals and falling edges of another set of main row activating signals. Main row activating signal RCNTAA<2:0> to RCNTAC<2:0> maintain an H level period thereof at least until active command ACT is applied in a next clock cycle.

Therefore, with three main row activation signal generating circuits provided, an H level period and L level period of each of main row activating signals RCNTAA<2:0> to RCNTAC<2:0> can be held for a period of one or more clock cycle time of clock signal CLK (CLK0).

Each main row activating signal can be relatively slowly changed and internal local row activating signals are generated utilizing the rising edges and falling edges of different sets of main row activating signals. By adjusting the intervals among these edges appropriately, a time period between bit line equalization and the start of a sensing operation can be reduced.

Main row activating signals RCNTAA<2:0> to RCNTAC<2:0> are signal independent of a bank address and are merely activated when row active command ACT is applied. Therefore, no necessity arises for changing a configuration of main row activation signal generating circuits GEN0 to GEN2 even when the number of banks is changed, achieving easy adaptation to a change in bank configuration.

In each clock cycle, a rising edge and falling edge of main row activating signals are used and thereby, internal operation timings can be correctly determined in synchronization with rising edges and falling edges of main row activating signals RCNTAA<2:0> to RCNTAC<2:0>.

FIG. 10A is a diagram schematically showing a configuration of the ACT counter shown in FIG. 8. In FIG. 10A, ACT counter 90 includes: AND circuits 91c and 91e each receiving row active command (active instruction signal) ACT and clock signal CLK (CLK0); a latch 92a latching a signal applied to an input D thereof in response to an output signal of AND circuit 91c; a latch 92b latching a signal applied to an input thereof D in response to the output signal of AND circuit 91e; latches 93a and 93b latching signals from respective outputs Q of latches 92a and 92b in response to clock signal CLK; an inverter 91a receiving a signal from the output Q of latch 93a; an AND circuit 91b receiving a signal from the output Q of latch 93b and an output signal of inverter 91a to apply an output signal thereof to the input D of latch 92a; and a NOR circuit 91d receiving signals from the outputs Q of latches 93a and 93b to apply an output signal thereof to the input D of latch 92b.

Latches 92a and 92b take in the signals applied to the inputs D when the signals applied to the inputs E are at H level, and enter latching state when the signals applied to the inputs E attains L level. Latches 92a and 92b resets the signals of the outputs Q to L level in response to reset signal RST. Latches 93a and 93b take in the signals applied to the input D when clock signal CLK is at L level, and enter a latching state when clock signal CLK attains H level.

ACT counter 90 further includes: an inverter 91f receiving a signal from the output Q of latch 93a; an inverter 91g receiving a signal from the output Q of latch 93b; an AND circuit 91h receiving a signal from the output Q of latch 93a and an output signal of inverter 91g to generate count bit ACN<2>; an AND circuit 91i receiving an output signal of inverter 91f and a signal from the output Q of latch 93b to generate count bit ACN<1>; and an AND circuit 91j receiving output signals of inverters 91f and 91g to generate count bit ACN<0>.

ACT counter 90 is a 2 bit counter and latches 92b and 93b calculate a count value of the lower bit and latches 92a and 93a calculate a count value of the upper bit. A decode circuit decoding the count bits is constituted of inverters 91f and 91g and AND circuits 91h to 91j.

FIG. 10B is a diagram showing an example of the configuration of latches 92a and 92b shown in FIG. 10A. In FIG. 10B, there is representatively shown one latch 92 since latches 92a and 92b each have the same configuration as others.

In FIG. 10B, latch 92 includes: an inverter 95a receiving a signal applied to an input E; a transmission gate 95b passing a signal applied to an input D in accordance with an output signal of inverter 95a and a signal of the input E therethrough; an inverter latch 95c latching a signal transferred from transmission gate 95b; an inverter 95e inverting a latch signal of inverter latch 95c to output the inverted signal from an output Q; and a transistor 95d resetting the latch signal of inverter latch 95c in accordance with reset signal RST.

In FIG. 10B, resetting transistor 95d is formed of an N-channel MOS transistor (insulated gate field effect transistor) and holds the input node of inverter latch 95c at ground potential level to set the signal from the output Q to L level when reset signal RST attains H level.

FIG. 10C is a diagram showing an example of the configuration of latches 93a and 93b shown in FIG. 10A. In FIG. 10C, there is representatively shown one latch 93 since latches 93a and 93b each have the same configuration as others.

In FIG. 10C, latch 93 includes: an inverter 96a inverting a signal applied to an input E_B; a transmission gate 96b passing a signal applied to an input D in accordance with a signal of input E_B and an output signal of inverter 96a; an inverter latch 96c latching a signal transmitted through transmission gate 96b; and an inverter 96d inverting a latch signal of inverter latch 96c to apply the inverted signal to an output Q.

No resetting function is provided to latch 93 shown in FIG. 10C. Latches 92a and 92b at the preceding stage have a resetting function and latch signals of latches 93a and 93b are also reset to an initial state according to initialized data of latches 92a and 92b at the preceding stage in synchronization with clock signal CLK. Now, brief description will be given of operations in ACT counter 90 shown in FIGS. 10A to 10C.

In an initial state, latches 92a and 92b are reset by reset signal RST and the signals from the outputs Q are at L level. When a clock signal CLK attains L level, latches 93a and 93b take in and latch the output signals of latches 92a and 92b, and therefore, the output signals of latches 93a and 93b are also at L level. Accordingly, in the initial state, the output signals of inverters 91f and 91g are at H level and accordingly, count bit ACN<0> from AND circuit 91j is at H level and the remaining count bits ACN<2:1> are both at L level.

AND circuits 91c and 91e output the signals at L level while row active command ACT is not applied. Therefore, latches 92a and 92b maintains a latching state since transmission gate 95b shown in FIG. 10B is in a non-conductive state. Therefore, ACT counter 90 maintains a reset state thereof until active command ACT is applied. At this time, an output signal of NOR circuit 91d is at H level and an output signal of AND circuit 91b is at L level.

When row active command ACT is applied, output signals of AND circuit 91c and 91e attain H level in synchronization with a rise of clock signal CLK, latch 92a takes in the output signal of AND circuit 91b to output a signal at L level from the output Q thereof. On the other hand, latch 92b takes in a signal at H level from NOR circuit 91d in response to a rise of an output signal of AND circuit 91e to output a signal at H level. Latches 93a and 93b are in a latching state while clock signal CLK is at H level. Therefore, in this case, when row active command ACT is applied, main row activation signal generating circuit GEN0 shown in FIG. 9 is enabled to generate main row activating signals RCNTAA<0> to RCNTAC<0> according to row active command ACT.

When clock signal CLK attains L level, transmission gate 96b shown in FIG. 10C turns conductive to take in output signals of latches 92a and 92b and to output the taken in signals from the outputs Q. In response, an output signal of latch 93b attains H level, while the output signal of latch 93a maintains L level.

An output signal of inverter 91a falls to L level in response to a change in output signals of latches 93a and 93b. An output signal of inverter 91f is at H level. Therefore, count bit ACN<1> from AND circuit 91i rises to H level, while count bit ACN<0> falls to L level. When an output signal of latch 93b attains H level, the output signal of NOR circuit 91d attains L level and the output signal of AND circuit 91b attains H level.

Subsequently, when row active command ACT is again applied, latch 92b takes in and outputs a signal at L level outputted from NOR circuit 91d. On the other hand, latch 92a takes in and outputs a signal at H level from AND circuit 91b. Therefore, when the next clock signal CLK falls to L level, a signal at H level is outputted from latch 93a, while a signal at L level is outputted from latch 93b. Therefore, an output signal of inverter 91d turns H level, an output signal of inverter 91f turns L level, and count bit ACN<1> attains L level while count bit ACN<2> from AND circuit 91h attains H level.

When an output signal of latch 93a attains H level, an output signal of inverter 91a turns L level and in response, the output signal of AND circuit 91b falls to L level. On the other hand, NOR circuit 91d outputs a signal at L level as the output signal of latch 93a is at H level.

When row active command ACT is again applied, latch 92b takes in and latches a signal at L level and latch 93b enters a through state in synchronization with a fall of clock signal CLK to output a signal at L level received from latch 92b. Likewise, latch 92a takes in and latches a signal at L level from AND circuit 91b in synchronization with a rise of clock signal CLK and successively, latch 93a takes in and outputs a signal received from latch 92a in response to a fall of clock signal CLK. Therefore, output signals from latches 93a and 93b both attain L level and count bit ACN<0> attains H level, while count bit ACN<2> attains L level.

A so-called ternary counter is formed by using ACT counter 90 and count bit ACN<0> attains H level each time row active command is applied thrice, and main row activation signal generating circuits GEN0 to GEN2 shown in FIG. 9 can be sequentially activated.

Figure 11:
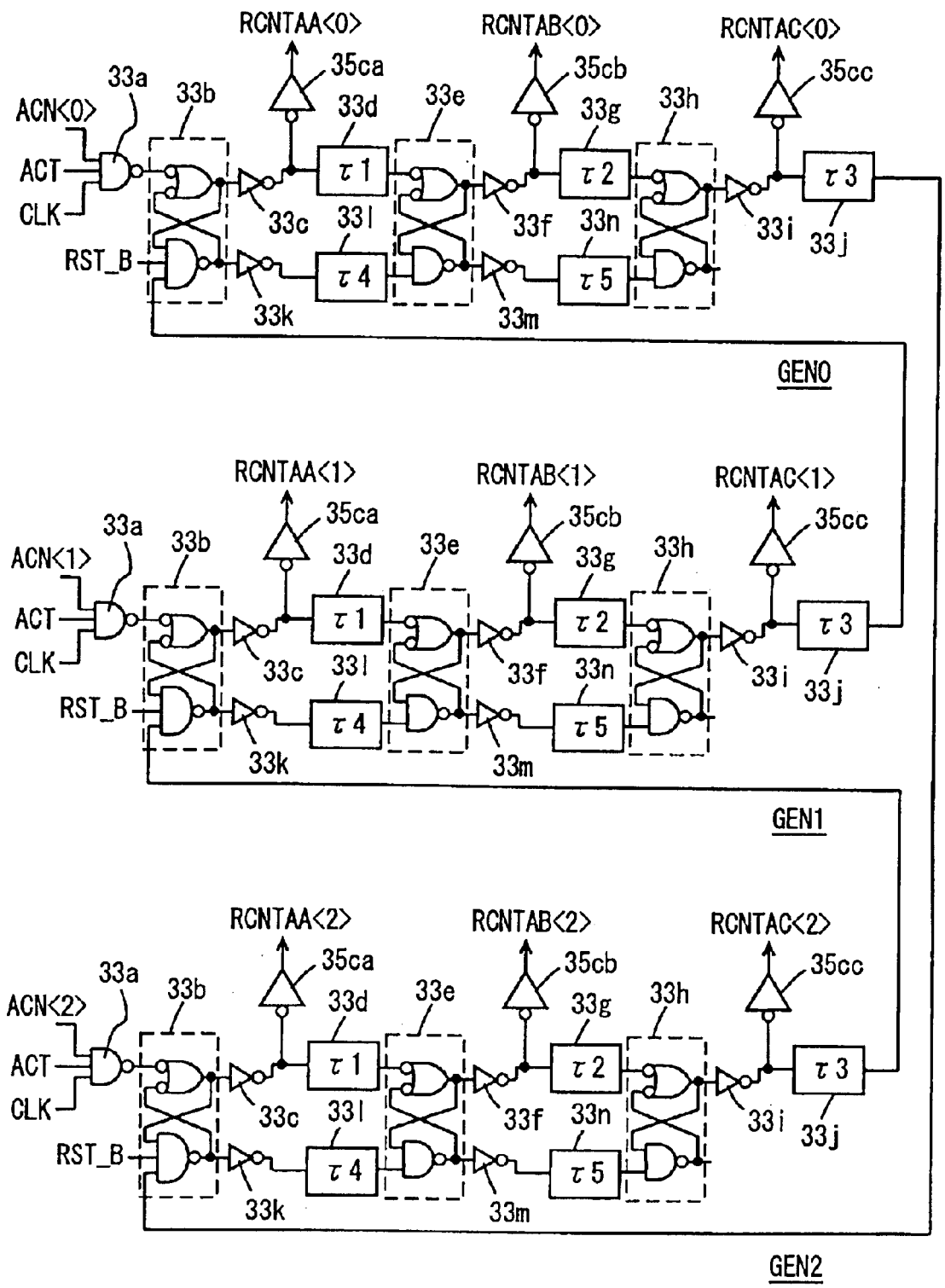
FIG. 11 is a diagram showing a configuration of main row activating signal generation circuits shown in FIG. 8.

FIG. 11 is a diagram showing an example of the configuration of main row activation signal generating circuits GEN0 to GEN2 shown in FIG. 8. Since main row activation signal generating circuits GEN0 to GEN2 each have the same configuration as others, the same reference numerals are attached to corresponding components in each circuit. Since main row activation signal generating circuits GEN0 to GEN2 are included in main row activation control circuit 33, a reference numeral 33 is mainly used for these components.

In FIG. 11, main row activation signal generating circuit GEN0 includes: a NAND circuit 33a receiving row active command (or row active signal) ACT, internal clock CLK (CLK0) and count bit ACN<0>; a set/reset flip-flop 33b being set when an output signal of NAND circuit 33a is at L level to output a signal in an active state (at H level) to a first output; an inverter 33c inverting a signal at the first output of set/reset flip-flop 33b; a driver 35ca receiving an output signal of inverter 33c to generate main row activating signal RCNTAA<0>; a delay circuit 33d delaying an output signal of inverter 33c by a time τ1; a set/reset flip-flop 33e being reset when an output signal of delay circuit 33d is at L level to drive a signal at the first output to H level; an inverter 33f inverting a signal of a first output of set/reset flip-flop 33e; a driver 35cb inverting an output signal of inverter 33f to generate main row activating signal RCNTAB<0>; a delay circuit 33g delaying an output signal of inverter 33f by a time τ2; a set/reset flip-flop 33h being set when an output signal of delay circuit 33g is at L level to output a signal at H level to a first output thereof; an inverter 33i inverting a signal of the first output of set/reset flip-flop 33h; and a driver 35cc inverting an output signal of inverter 33i to generate main row activating signal RCNTAC<0>.

When a time τ1 elapses after main row activating signal RCNTAA<0> is activated by delay circuits 33d and 33g, main row activating signal RCNTAB<0> is activated. Then, when a time τ2 elapses thereafter, main row activating signal RCNTAC<0> is activated. Main row control signals RCNTAA<0> to RCNTAC<0> different in rising phase from each other are generated in response to activation of row active command (row active instructing signal) ACT. Drivers 35ca and 35cb have the same driving capability each other.

Main row activation signal generating circuit GEN0 further includes a delay circuit 33j delaying an output signal of inverter 33i by a time τ3 to apply a resultant signal to main row activation signal generating circuit GEN2 as a reset signal. Set/reset flip-flop 33b provided to main row activation signal generating circuit GEN2 is reset according to an output signal of delay circuit 33j.

Reset signal RST_B and the output signal of delay circuit 33j at the last stage of main row activation signal generating circuit GEN1 are applied to set/reset flip-flop 33b of main row activation signal generating circuit GE0. Therefore, main row activation signal generating circuit GEN0 is reset when a prescribed time elapses after reset signal RST_B is applied or main row activating signal RCNTAC<1> is driven to H level.

Main row activation signal generating circuit GEN0 further includes: an inverter 33k inverting a signal of a second output of set/reset flip-flop 33b; a delay circuit 33l delaying an output signal of inverter 33k by a time τ4 to reset set/reset flip-flop 33e; an inverter 33m inverting a signal of a second output of set/reset flip-flop 33e; and a delay circuit 33n delaying an output signal of inverter 33m by a time τ5.

When an output signal of delay circuit 33n attains L level, set/reset flip—flip 33h is reset. Reset signal RST_B is a system reset signal, for example, and reset signal RST_B is set to L level when a power is up or the system is reset. Set/reset flip-flop 33b is reset by delay circuit 33l, and when a time τ4 elapses after main row activating signal RCNTAA<0> is driven to L level, main row activating signal RCNTAB<0> is deactivated (driven to L level). When a time τ5 elapses after main row activating signal RCNTAB<0> is deactivated by delay circuit 33n, set/reset flip-flop 33h is reset and main row activating signal RCNTAC<0> is deactivated.

Main row activation signal generating circuit GEN1 is of the same configuration as main row activation signal generating circuit GEN0. Count bit ACN<1> is applied to NAND circuit 33a. An output signal of delay circuit 33j at the last stage of main row activation signal generating circuit GEN2 is applied to set/reset flip-flop 33b as a reset signal. Main row activating signals RCNTAA<1> to RCNTAC<1> are generated from main row activation signal generating circuit GEN1.

Main row generation signal generating circuit GEN2 is of the same configuration as main row activation signal generating circuits GEN0 and GEN1 and count bit ACN<2> is applied to NAND circuit 33a at the first stage thereof. An output signal of delay circuit 33j at the last stage of main row activation signal generating circuit GEN0 and system reset signal RST_B are applied as a reset signal to set/reset flip-flop 33b. Main row activating signals RCNTAA<2> to RCNTAC<2> are generated in a prescribed sequence from main row activation signal generating circuit GEN2.

Main row activation signal generating circuits GEN0 to Gen2 have the same configuration as each other and delay times of delay circuits in each of the main row activation signal generating circuits are also the same as the others. Therefore, main row activating signals RCNTAA to RCNTAC are generated in the same phase relationship in each of sets of main row activating signals RCNTAA<0> to RCNTAC<0>, main row activating signals RCNTAA<1> to RCNTAC<1> and main row activating signals RCNTAA<2> to RCNTAC<2>.

Note that delay circuit 33j at the last stage is provided in order to deactivate a main row activating signal in an active state. Therefore, delay circuit 33j needs not particularly to be provided.

A generation sequence of main row activating signals shown in FIG. 9 can be achieved by using man row activation signal generating circuits GEN0 to GEN2 shown in FIG. 11.

Figure 12:
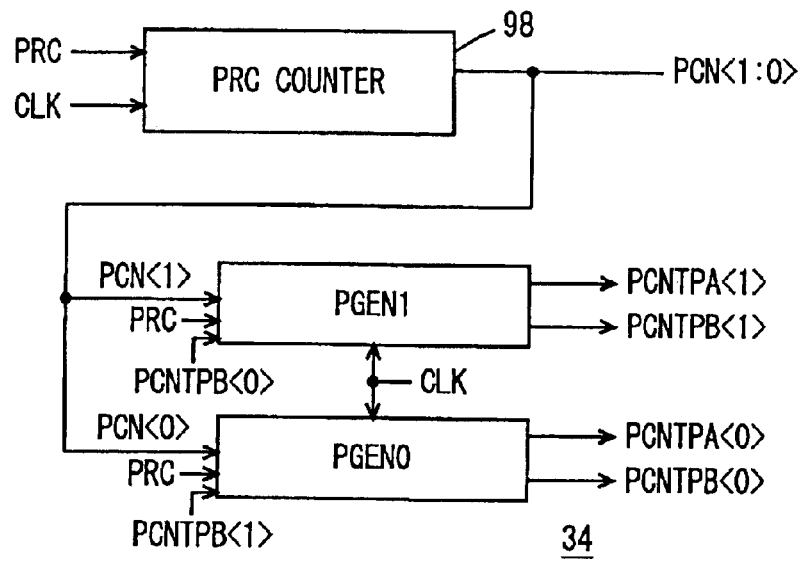
FIG. 12 is a diagram schematically showing a configuration of a main precharge control circuit shown in FIG. 3.

FIG. 12 is a diagram schematically showing a configuration of main precharge control circuit 34 generating a main precharge activating signal for restoring a selected bank to a precharge state. In FIG. 12, main precharge control circuit 34 includes: a PRC counter 98 counting precharge instructing signal precharge command) PRC in response to a rise of clock signal CLK (CLK0); a main precharge activation signal generating circuit PGEN0 enabled when count bit PCN<0> of PRC counter 98 is at H level to generate main precharge activating signals RCNTPA<0> and RCNTPB<0> in accordance with clock signal CLK and precharge instructing signal PRC; and a main precharge activation signal generating circuit PGEN1 enabled when count bit PCN<1> from PRC counter 98 is at H level to generate main precharge activating signals RCNTPA<1> and RCNTPB<1> in response to precharge instructing signal PRC and clock signal CLK.

PRC counter 98 generates a 2-bit count value <1:0>. Main precharge activation signal generating circuit PGEN0 is reset in response to activation of main precharge activating signal PCNTPB<1> and main precharge activation signal generating circuit PGEN1 is reset in response to activation of main precharge activating signal PCNTPB<0>. Main precharge activation signal generating circuits PGEN0 and PGEN1 have a configuration similar to that of main row activation signal generating circuit GEN0 and GEN1. Tow-phase main precharge activation signals are used instead of the three-phase main row activating signals.

Figure 13:
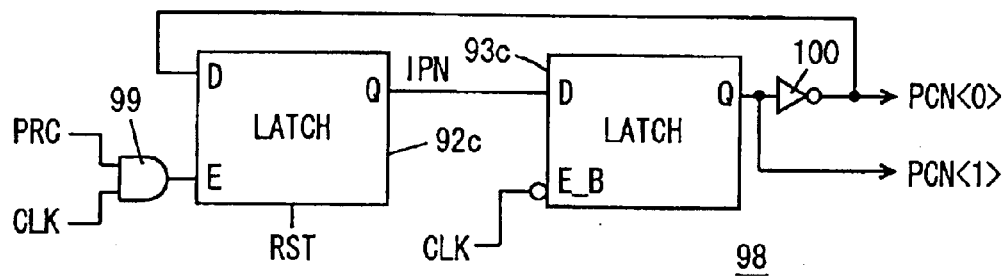
FIG. 13 is a diagram schematically showing a configuration of a PRC counter shown in FIG. 12.

FIG. 13 is a diagram schematically showing a configuration of PRC counter 98 shown in FIG. 12. In FIG. 13, PRC counter 98 includes: an AND circuit 99 receiving precharge command (precharge instructing signal) PRC and clock signal CLK; a latch 92c receiving an output signal of AND circuit 99 at an input E thereof; a latch 93c taking in an output signal of latch 92c according to clock signal CLK applied to an input E_B thereof to generate count bit PCN<122 ; and an inverter circuit 100 inverting an output signal PCN<1> of latch 93c to generate count bit PCN<0>. An output signal of inverter 100 is fed back to an input D of latch 92c.

An output signal of latch 92c is set to L level according to reset signal RST. Latches 92c and 93c are the same in configuration as the respective latches 92 and 93 shown in FIGS. 10B and 10C. Inverter circuit 96d (see FIG. 10C) at the output stage included in latch 93c is equal in driving capability to inverter circuit 100. Thereby, a signal propagation delay of count bits PCN<1:0> to a local control circuit can be set equal to each other.

Figure 14:
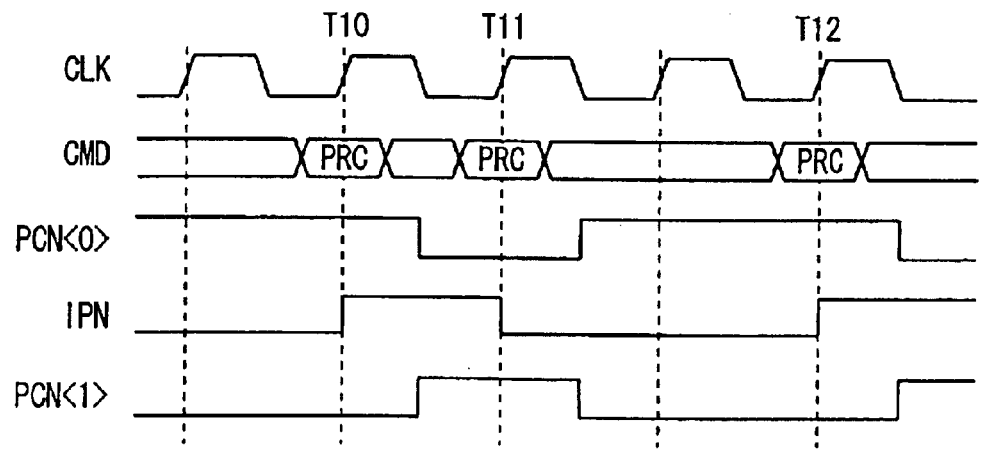
FIG. 14 is a timing diagram representing operations in the PRC counter shown in FIG. 13.

In the PRC counter shown in FIG. 13, in an initial state, an output signal of latch 92c is at L level and in response, an output signal of latch 93c is also at L level. Therefore, count bit PCN<0> is at H level and count bit PCN<1> is at L level. Such states are maintained until precharge command PRC is applied. Now, description will be given of operations in PRC counter shown in FIG. 13 with reference to FIG. 14. In the following description as well, there is shown, as an example, a case where a command is decoded in the logic and applied as an operating mode instructing signal. A precharge command may be decoded in the semiconductor device to generate precharge instructing signal PRC.

In an initial state, PRC counter 98 is reset by reset signal RST and counter bit PCN<0> is at H level while counter bit PCN<1> is at L level.

When precharge command PRC is applied at time T10, latch 92c takes in count bit PCN<0> in synchronization with a rise of clock signal CLK to raise output signal IPN to H level. When clock signal CLK attains L level, latch 93c takes in output signal IPN of latch 92c, raises an output signal thereof, that is, count bit PCN<1> to H level and in response, count bit PCN<0> attains L level.

When precharge command PRC is again applied at time T11, latch 92c takes in count bit PCN<0> at L level and output signal IPN thereof attains L level. When clock signal CLK attains L level, latch 93c takes in output signal IPN at L level of latch 92c to set count bit PCN<1> to L level.

When precharge command PRC is again applied at time 12, output signal IPN of latch 92c rises to H level and states of count bits PCN<0> and PCN<1> change in response to a fall of clock signal CLK.

Therefore, in PRC counter shown in FIG. 13, count bits PCN<0> and PCN<1> are alternately driven to H level in synchronization with a fall of clock signal CLK each time precharge command PRC is applied, and in response, main precharge activation signal generating circuits PGEN0 and PGEN1 shown in FIG. 12 are alternately activated.

Main precharge activating signals RCNTPA<1:0> and RCNTPB<1:0> are activated in a prescribed sequence when precharge command PRC is applied and are not coupled or combined with a bank address. Therefore, when the banks are expanded, the same configuration is used and there is no need to change the configuration of main precharge activation signal generating circuits.

When one of main precharge activation signal generating circuits PGEN0 and PGEN1 is activated, the other is deactivated. Main precharge activating signals RCNTPA<1:0> and RCNTPB<1:0> can have their respective active periods set to the period between successive application of the precharge command PRC, to have sufficient pulse widths. By generating local precharge control signals with rising edges and falling edges of main precharge activating signals RCNTPA<1:0> and RCNTPB<1:0>, the local precharge control signals can be generated with certainty without suffering a restraint on a pulse width of main precharge activating signal.

Figure 15:
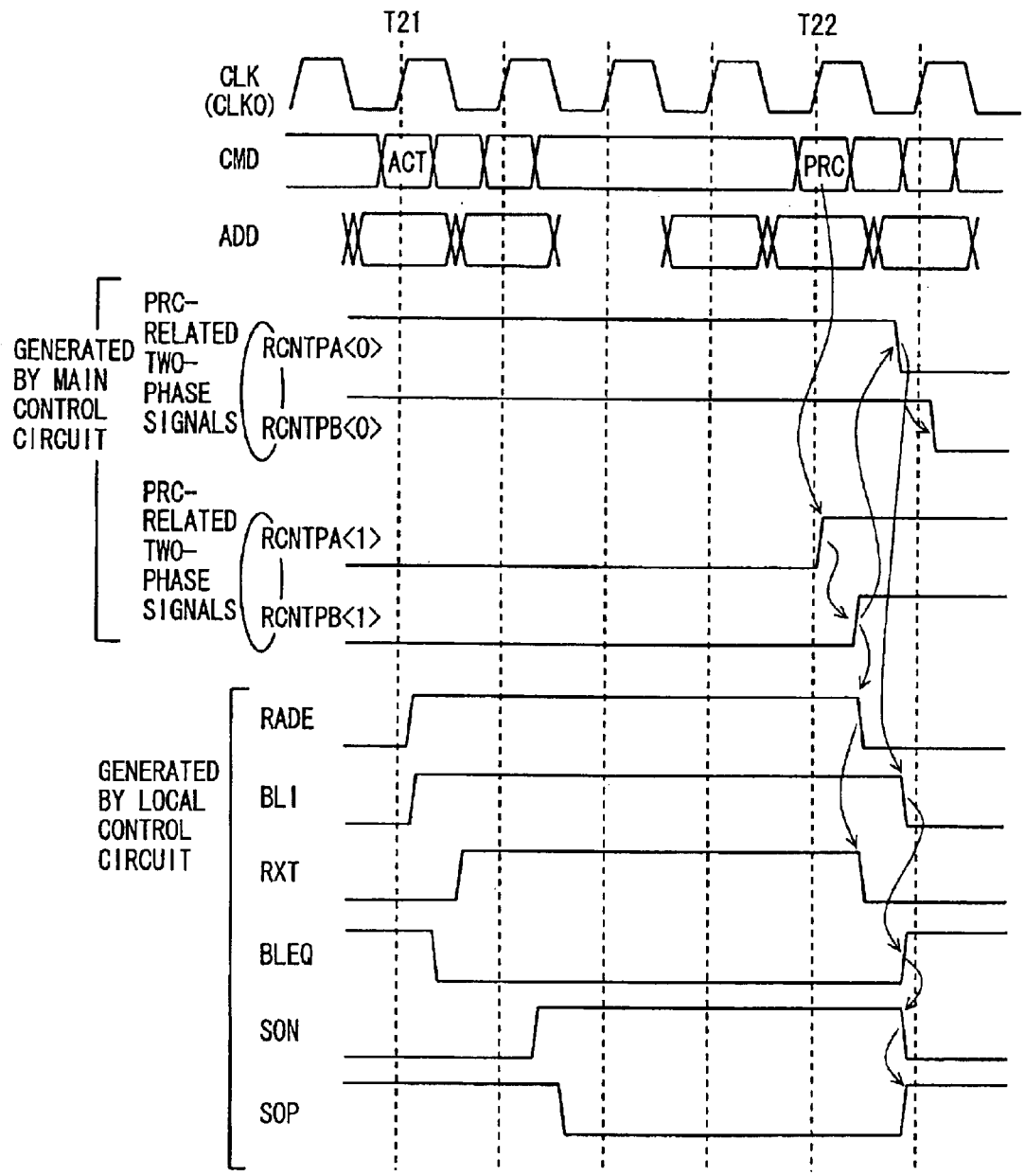
FIG. 15 is a timing diagram representing operations in precharging of the circuit shown in FIG. 3.

FIG. 15 is a diagram showing a restoration sequence to an initial state of local row-related control signal when precharge command PRC is applied. Brief description will now be given of an initialization sequence for a local row control signal below with reference to FIG. 15.

In FIG. 15, there is shown a state in which main precharge activating signals RCNTPA<0> and RCNTPB<0> are maintained at H level by previous application of the precharge command and main precharge activating signals RCNTPA<1> and RCNTPB<1> are maintained at L level.

In this state, main precharge activation signal generating circuit PGEN0 is activated by the precharge command according to count bit PCN<0> of PRC counter 98 to raise main precharge activating signals RCNTPA<0> and RCNTPB<0> to H level. Then, count bit PCN<1> of PRC counter 98 attains H level in response to a fall of clock signal CLK and main precharge activation signal generating circuit PGEN1 is enabled. Therefore, when the precharge command is subsequently applied, main precharge activation signal generating circuit PGEN1 is activated to generate the main precharge activating signals.

When row active command ACT is applied at time T21, the local row control signals are activated/deactivated in a prescribed sequence. Even if row active command ACT is applied, there arise no change in state of main precharge activating signal RCNTRA<1:0>.

When precharge command PRC is applied at time T22, main precharge activating signals RCNTPA<1> and RCNTPB<1> rise to H level in a prescribed sequence. At this time, according to activation of main precharge activating signal RCNTPB<1>, main precharge activation signal generating circuit PGEN0 is reset and main precharge activating signals RCNTPA<0> and RCNTPB<0> are sequentially deactivated.

Row address decode enable signal RADE and word line drive timing signal RXT are raised to H level in response to a rise of main precharge activating signal RCNTPB<1>. Successively, in response to a fall of precharge activating signal RCNTPA<0>, bit line isolation instructing signal BLI is lowered to L level and bit line equalize instructing signal BLEQ is raised to H level. In response to a fall of main precharge activating signal RCNTPA<0>, sense amplifier activating signal SON is lowered to L level and sense amplifier activating signal SOP is raised to H level.

One rising edge and one falling edge in main precharge activating signals RCNTPA<1:0> and RCNTPB<1:0> are utilized to restore the local row-related control signal to an initial state. Therefore, if driving of main precharge activating signals RCNTPA<1:0>22 to L level is completed within a clock cycle in which precharge command PRC is applied, main precharge activation signal RCNTPA<0> can be driven to H level to successfully perform a precharge operation when precharge command PRC is again applied in the next clock cycle at time T22 in accordance with a high speed clock signal. Precharging operations are performed using a rise of main precharge activating signals RCNTPB<1:0> and a fall of main precharge activating signal RCNTPA<1:0>. However, precharging operations may be performed using a single phase main precharge activating signal and utilizing a rising edge of main precharge activating signal RCNTPA<1> and a falling edge of main precharge activating signal RCNTPA<0>.

Three main precharge activation signal generating circuits PGEN0 to PGEN2 are used and, similarly to main row activating signals RCNTRA to RCNTRC, three sets of main precharge activating signals RCNTPA<2:0> and RCNTPB<2:0> may be used. In this case, for an L level period of main precharge activating signal RCNTPA, at least one or more cycles of clock signal CLK can be secured.

Figure 16:
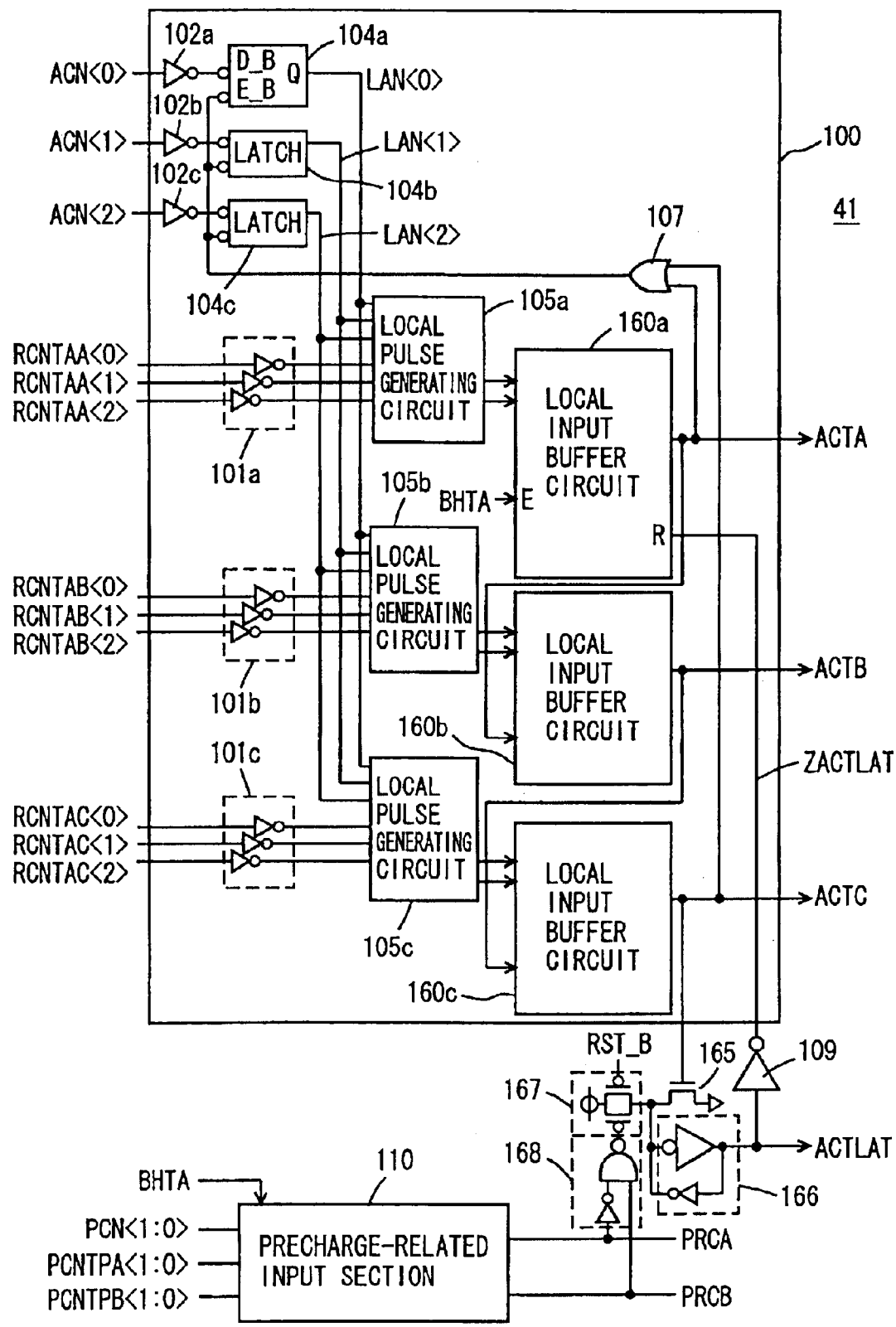
FIG. 16 is a diagram schematically showing a configuration of a main part of a row-related local control circuit shown in FIG. 3.

FIG. 16 is a diagram schematically showing a configuration of row-related local control circuit 41 included in the local control circuit. In FIG. 16, row-related local control circuit 41 includes: an active-related input section 100 generating internal row control signals ACTA, ACTB and ACTC in accordance with main row activating signals RCNTRA<2:0> to RCNTRC<2:0> and count bits ACN<2:0>; and a precharge-related input section 110 generating internal precharge control signals PRCA and PRCB in accordance with main precharge activating signals RCNTPA<1:0> and RCNTPB<1:0> and precharge count bits PCN<1:0>.

Active-related input section 100 and precharge-related input section 110 are selectively activated according to block select signal BHTA from block address decoder 40 shown in FIG. 3.

Active-related input section 100 includes: an input circuit 101a receiving main row activating signals RCNTAA<2:0> in parallel; an input circuit 101b receiving main row activating signals RCNTAB<2:0> in parallel; an input circuit 101c receiving main row activating signals RCNTAC<2:0> in parallel; input inverter buffer circuits 102a to 102c respectively receiving count bits ACN<2:0>; latches 104a to 104c latching output signals of input inverter buffer circuits 102a to 102c to generate latch count bits LAN<2:0>; and local pulse generating circuits 105a to 105c provided corresponding to respective input circuits 101a to 101c.

Each of local pulse generating circuits 105a to 105c, of which configuration will be described later, includes two sets of tri-state inverter buffers provided to corresponding to latch circuits 104a to 104c to buffer main row-related control signal from corresponding input circuits 101a to 101c according to latch count bits LAN<2:0> to generate two sets of buffered row-related control signals.

Active-related input section 100 further includes: a local input buffer circuit 160a buffering an output signal of local pulse generating circuit 105a when block select signal BHTA is active; a local input buffer circuit 160b enabled in response to activation of internal row control signal ACTA, to generate internal row control signal ACTB according to an output signal of local pulse generating circuit 105b; a local input buffer circuit 160c enabled when internal row control signal ACTB is active, to buffer and latch an output signal of local pulse generating circuit 105c for generating internal row control signal ACTC; and an OR circuit receiving internal row control signals ACTA and ACTC to generate latch control signals for latches 104a to 104c.

Each of input circuits 101a to 101c includes: inverter circuits of 3 bits provided to corresponding the main row activating signals of 3 bits and inverting corresponding main row activation signals to apply the inverted signals to corresponding local pulse generating circuits 105a to 105c at the next stage.

Latches 104a to 104c have a configuration similar to latch 93 shown previously in FIG. 10C, and enter a through state when an output signal of OR circuit 107 is at L level, and enters a latching state when the output signal of OR circuit 107 is at H level. Local pulse generating circuit 105a to 105c each generate two sets of main row activating signals correlated with each other. In local input buffer circuits 160a to 106c, NAND operations are performed on corresponding main row activating signals to generate internal row control signals ACTA to ACTC. Thereby, in local input buffer circuits 160a to 160c, corresponding main row activating signals can be raised and lowered in one clock cycle.

Figure 17:
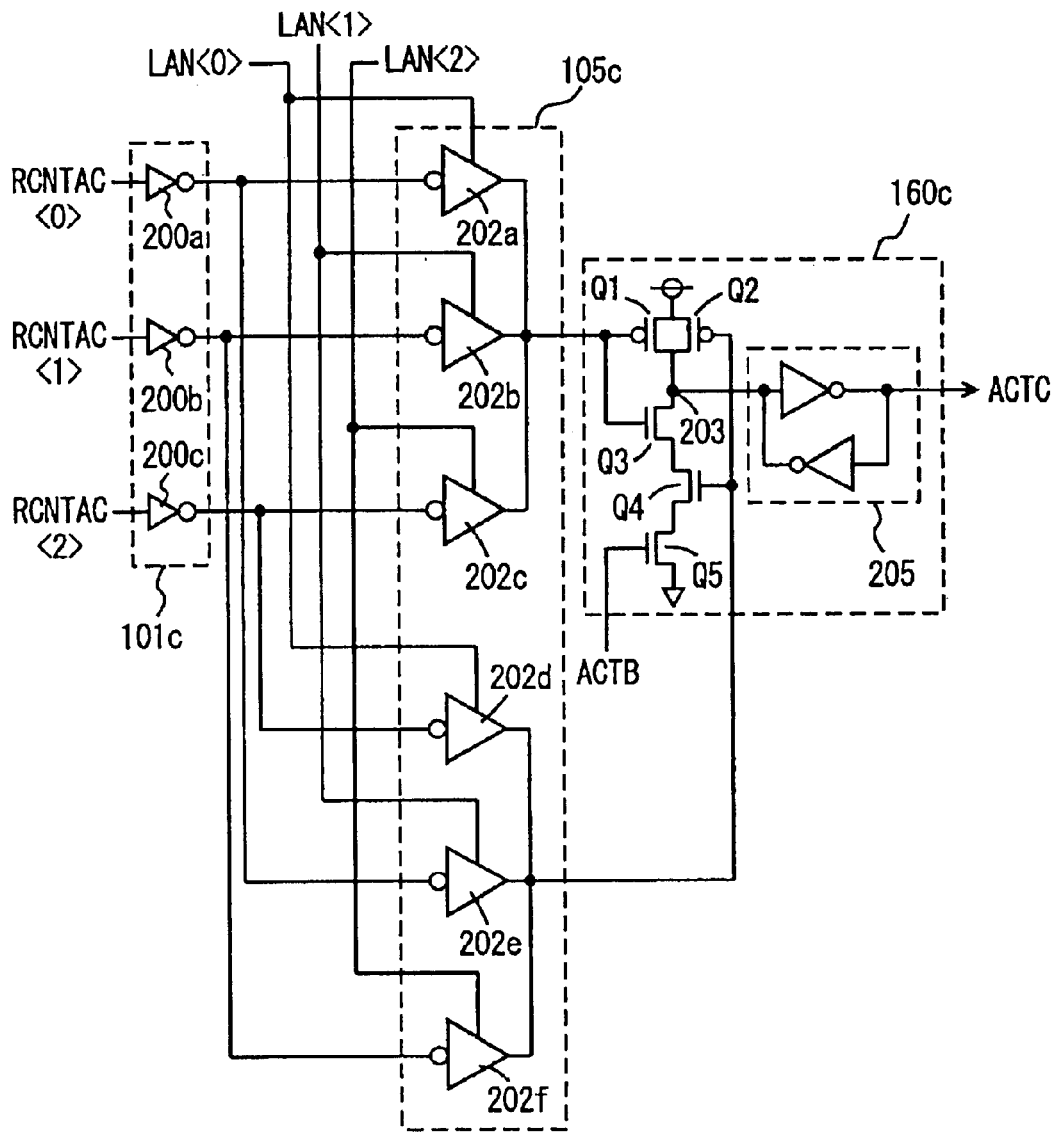
FIG. 17 is a diagram showing an example of configuration of a local pulse generating circuit and a local input buffer circuit shown in FIG. 16.

FIG. 17 is a diagram showing a configuration of local pulse generating circuit 105c and local input buffer circuit 160c shown in FIG. 16. In input buffer circuit 101c, inverter buffers 200a to 200c are provided corresponding to the respective main precharge activating signals RCNTAC<0> to RCNTAC<2>. Local pulse generating circuit 105c includes: tri-state inverter buffers 202a to 202c provided corresponding to the respective inverter buffers 200a to 200c and being enabled respectively by latch count bits LAN<0> to LAN<2>; and tri-state inverter buffers 202d to 202f provided, in parallel to tri-state inverter buffers 202a to 200c, corresponding to respective inverter buffers 200a to 200c. Tri-state inverter buffers 202a to 202c receive main row activating signals RCNTAC<0> to RCNTAC<2> applied through respective inverter buffers 200a to 200c, respectively. Tri-state inverter buffer 202d is enabled when latch count LAN<0> is at H level and inverts and outputs main row activating signal RCNTAC<2> from inverter buffer 200c. Tri-state inverter buffer 202e is enabled when latch count LAN<1> is at H level and inverts and outputs an inverted signal of main row activating signal RCNTAC<0> from inverter buffer 200a. Tri-state inverter buffer 202f is enabled when latch count LAN<2> is at H level and inverts and outputs main row activating signal RCNTAC<1> received through inverter buffer 200b.

Outputs of tri-state inverter buffer 202a to 202c are coupled together and outputs of tri-state inverter buffer 202d to 202f are coupled together.

Therefore, in local pulse generating circuit 105c, when latch count LAN<0> is at H level, tri-state inverters 202a and 202d are enabled and main row activating signals RCNTAC<0> and RCNTAC<2> are selected and applied to local input buffer circuit 160c at the subsequent stage. When latch count LAN<1> is at H level, tri-state inverters 202b and 202e are enabled and main row activating signals RCNTAC<1> and RCNTAC<0> are selected and applied to local input buffer circuit 160c at the subsequent stage.

When latch count LAN<2> is at H level, tri-state inverters 202c and 202f are enabled and main row activating signals RCNTAC<2> and RCNTAC<1> are selected and applied to local input buffer circuit 160c at the subsequent stage.

Local input buffer circuit 160c includes: a P-channel MOS transistor Q1 connected between node 203 and power supply node, and receiving output signals of tri-state inverter buffers 202a to 202c at a gate thereof; a P-channel MOS transistor Q2 connected between power supply node and node 203, and receiving output signals of tri-state inverter buffers 202d to 202f at a gate thereof; and an N-channel MOS transistors Q3 to Q5 connected in series between node 203 and ground node. The gate of MOS transistor Q3 is coupled to outputs of tri-state inverter buffers 202a to 202c. The gate of MOS transistor Q4 is coupled to outputs of tri-state inverter buffers 202d to 202f. Internal row control signal ACTB outputted by local input buffer circuit 160b at the preceding stage is applied to MOS transistor Q5.

Local input buffer circuit 160c further includes an inverter latch 205 inverting and latching a signal at node 203 to generate local row control signal ACTC.

Figure 18:
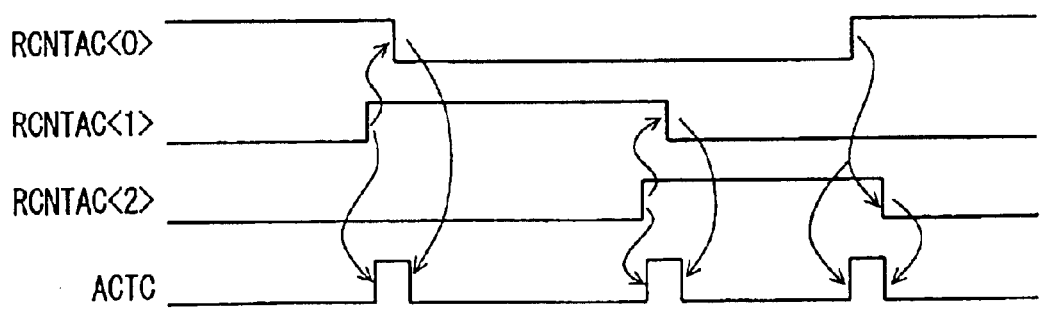
FIG. 18 is a timing diagram representing operations in circuitry shown in FIG. 17.

Internal row control signal ACTA to ACTC are activated in a prescribed sequence reliably by applying internal row control signal ACTB outputted by local input buffer circuit 160d at the preceding stage to local input buffer circuit 160c. Now, brief description will be given of operations in local pulse generating circuit 105c and local input buffer circuit 160c shown in FIG. 17 with reference to a timing diagram shown in FIG. 18.

A case is now considered where main row activating signal RCNTAC<122 rises to H level. In this case, latch count bit LAN<1> attains H level and tri-state inverter buffers 202b and 202e are enabled. Therefore, in local pulse generating circuit 105c, main row activating signals RCNTAC<1> and RCNTAC<0> are selected and applied to local input buffer circuit 160c. Main row activating signal RCNTAC<0> falls to L level when a prescribed time elapses after main row activating signal RCNTAC<1> rises to H level. Therefore, in input buffer circuit 160c, internal row control signal ACTC rises to H level when MOS transistors Q1 and Q2 both enter an off state and MOS transistors Q3 and Q4 both enter an on state. When main row activating signal RCNTAC<0> falls to L level, internal row control signal ACTC falls to L level.

When main row activating signal RCNTAC<2> rises to H level, main row activating signal RCNTAC<1> falls to L level after elapse of a prescribed time. During this operation, latch count bit LAN<2> is at H level, and main row activating signals RCNTAC<1> and RCNTAC<2> are selected by tri-state inverter buffers 202c and 202f and applied to local input buffer circuit 160c. Therefore, in this case as well, in local input buffer circuit 160c, MOS transistors Q3 and Q4 are set to an on state during a period when main row activating signals RCNTAC<2:1> both are at H level and internal row control signal ACTC attains H level.

When main row activating signal RCNTAC<0> rises to H level, main row activating signal RCNTAC<2> falls to L level when a prescribed time elapses thereafter. Therefore, in this case, tri-state inverter buffers 202a and 202b are enabled by latch count bit LAN<0>, and main row activating signals RCNTAC<0> and RCNTAC<2> are selected and applied to local input buffer 160c. Therefore, in this case as well, internal row control signal ACTC is set at H level during a prescribed period of time.

Therefore, even if main row activating signals RCNTAC<2:0> each have a long H level period and long L level period as well, a local row control circuit 41 is configured to generate an internal row control signal ACTC having a rising and a falling edge within one clock cycle, and therefore, a corresponding local circuit can be set to a state according to a designated operation mode in each clock cycle. In local row control circuit 41, a interconnection distance is short between input circuit 101c and local input buffer circuit 160c, rounding of a waveform and a propagation delay are less. Thus, a restraint on a pulse width of an internal row control signal is less as compared with the case of a main row activating signal, thereby enabling generation of internal row control signal ACTC having a correct waveform.

Returning again to FIG. 16, row-related local control circuit 41 further includes: a latch circuit 166; an N-channel MOS transistor 165 setting output signal ACTLAT of latch 166 to H level according to local row control signal ACTC; a logic circuit 168 generating a signal for changing a logic level of a latch signal of inverter latch 166 according to internal precharge control signals PRCA and PRCB from precharge-related input section 110; a reset circuit 167 resetting a logic level of the latch signal of inverter latch 166 according to an output signal of logic circuit 168 and reset signal RST_B; and an inverter 109 inverting latch signal ACTLAT to generate a complementary signal ZACTLAT.

Logic circuit 168 activates reset circuit 167 to reset latch signal ACTLAT of inverter latch 166 to L level when internal precharge control signal PRCA attains L level and internal precharge control signal PRCB attains H level. Inverter 109 inverts latch signal ACTLAT of inverter latch 166 and applies the inverted signal to local input buffer circuit 160a. When output signal ZACTLAT of inverter 109 is at L level, local input buffer circuit 160a does not alter a state of output signal ACTA thereof to maintain the latching state. Thereby, multiple selection of word lines in a selected memory block as detailed later can be prevented.

Precharge-related input section 110 also has a configuration similar to that of active-related input section 100 and includes: a local pulse generating circuit and a local input buffer circuit provided corresponding to each of internal precharge control signals PRCA and PRCB. In a local control circuit provided to a selected memory block, a row activating operation or a precharging operation is performed according to block hit signal (block select signal) BHTA from a block decoder.

Figure 19:
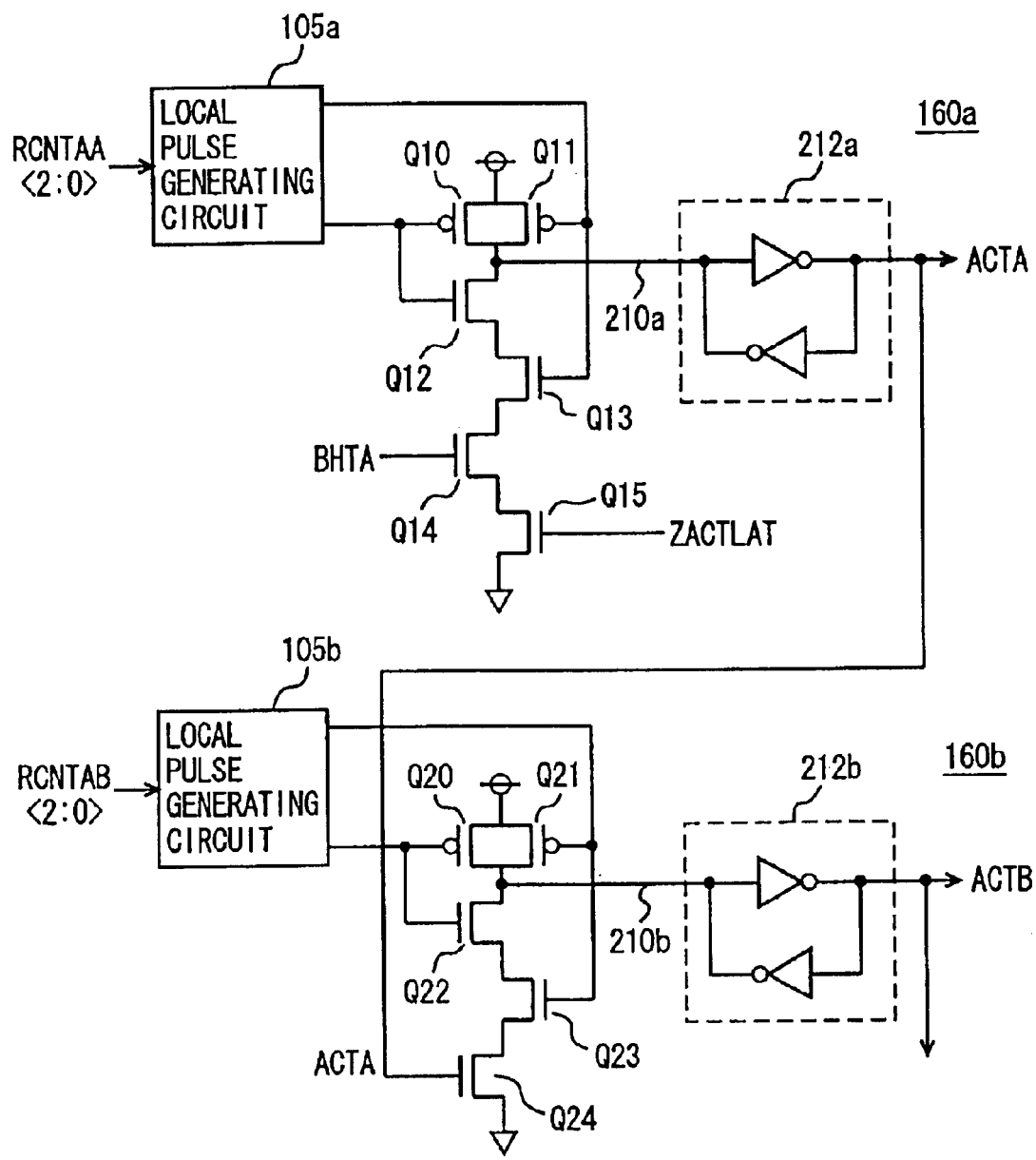
FIG. 19 is a diagram showing a configuration of the remainder of the local pulse generating circuit and a local input buffer circuit shown in FIG. 16.

FIG. 19 is a diagram showing a configuration of local input buffers 160a and 160b shown in FIG. 16. In FIG. 19, local input buffer circuit 160a includes: P-channel MOS transistors Q10 and Q11 connected in parallel between power supply node and a node 210a, and having a gate receiving an output signal of local pulse generating circuit 105a; MOS transistors Q12 to Q15 connected in series between node 210a and ground node; and an inverter latch 212a inverting and latching a signal at node 210a to generate internal row control signal ACTA.

MOS transistor Q12 has gate connected to the gate of MOS transistor Q10 and the gate of MOS transistor Q13 is connected to the gate of MOS transistor Q11. Block hit signal BHTA is applied to the gate of MOS transistor Q14 and an inverted latch signal ZACTLAT from inverter 109 shown in FIG. 16 is applied to the gate of MOS transistor Q15.

Local input buffer circuit 160b includes: P-channel MOS transistors Q20 and Q21 connected in parallel between power supply node and node 210b, and receiving output signals of local pulse generating circuit 105b at gates thereof; N-channel MOS transistors Q22 to Q24 connected in series between node 210b and ground node; and an inverter latch 212b inverting and latching a signal at node 210b to generate internal row control signal ACTB.

When a corresponding memory block is selected and a row is maintained in a selected state, in local input buffer circuit 160a, latch row activating signal ACTLAT latched in latch circuit 166 is at H level and output signal ZACTLAT of inverter 109 is at L level until a precharge command is applied. Therefore, in local input buffer circuit 160a, an input buffer constituted of MOS transistors Q10 to Q15 at the input stage outputs a signal at H level regardless of a logic level of an output signal of corresponding local pulse generating circuit 105a and in response, internal row control signal ACTA is maintained at L level. Therefore, even if block hit signal BHTA is driven to an active state while a corresponding memory block is in a selected state, the memory block in the selected state is not again activated. Thereby, multiple selection of word lines in a memory block is prevented and a circuit malfunction is also prevented.

Latches 104a to 104c shown in FIG. 16 has a configuration similar to that of latch 93 shown in FIG. 10C. Therefore, when an output signal of OR circuit 107 attains H level in accordance with activation of internal row control signal ACTA, latches 104a to 104c enter a latching state and the count of internal latch count bits LAN<2:0> does not change even if count of count bits ACN<2:0> changes. Main row activating signals are selected in respective local pulse generating circuits 105a to 105c according to latch count bits LAN<2:0>.

Therefore, even if count of count bits ACN<2:0> changes when latches 104a to 104c are in a latching state, main row activating signals RCNTAB<2:0> and RCNTAC<2:0> activated following first activated main row activating signals RCNTAA<2:0> can be taken in to active-related input section 100 to generate internal row control signals ACTB and ACTC. Thereby, even if row active command ACT is successively supplied at a high speed, an addressed memory block can be correctly selected.

When internal row control signal ACTC attains L level, internal row control signal ACTA has fallen to L level already, an output signal of OR circuit 107 attains L level and latches 104a to 104c can take in count bits ACN<2:0>. That is, renewed count bits can be taken in after all of internal row control signals ACTA to ACTC attain an active state and then attain an inactive state.

Note that the reason why inverter latches 212a, 212b and 205 are provided in respective input buffer circuits 160a to 160c is that even in the case in which an internal output node at the input stage is in a high impedance state (N-channel MOS transistor and P-channel MOS transistor are both in an off state), it is prevented that an internal control signal enters a floating state. For example, when main row activating signal RCNTAB is at H level, such a floating state occurs if internal row control signal ACTA attains L level when main row activating signal RCNTAB is at H level.

Figure 20:
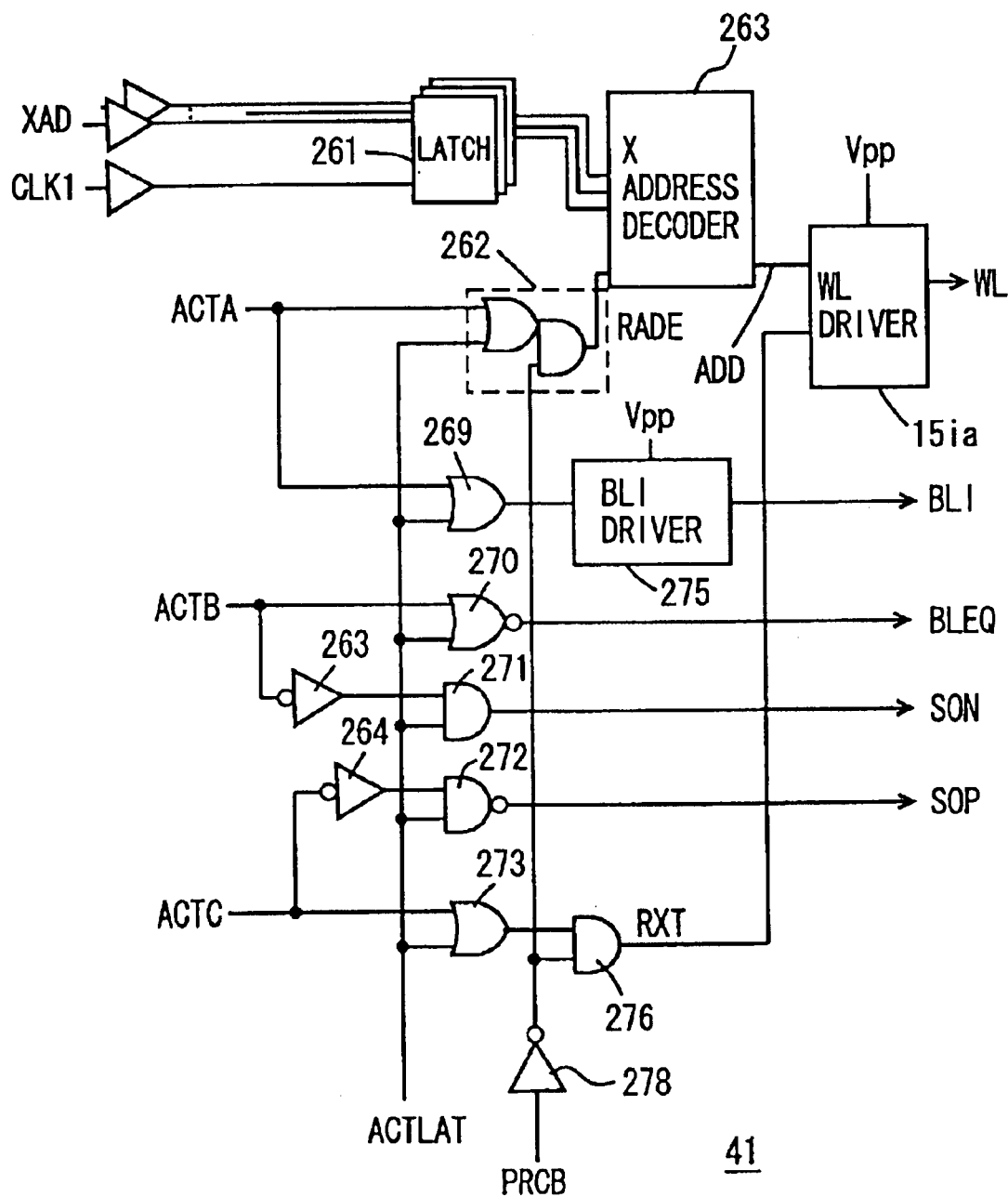
FIG. 20 is a diagram showing a configuration of a local control signal generating section of a row-related local control circuit shown in FIG. 3.

FIG. 20 is a diagram showing a configuration of a local row control signal generating section of row-related local control circuit 41. In FIG. 20, the local row control signal generating section includes an inverter 263 receiving internal row control signal ACTB; an inverter 264 receiving internal row control signal ACTC; a composite gate 262 receiving latch activating signal ACTLAT of inverter latch 166 shown in FIG. 16 to generate row address decode enable signal RADE; an OR circuit 269 receiving internal row control signal ACTA and latch signal ACTLAT; a NOR circuit 70 receiving latch signal ACTLAT and internal row control signal ACTB to generate bit line equalize instructing signal BLEQ; an AND circuit 271 receiving an output signal of inverter 263 and latch signal ACTLAT to generate sense amplifier activating signal SON; a NAND circuit 272 receiving an output signal of inverter 264 and latch signal ACTLAT to generate sense amplifier activating signal SOP; an OR circuit 273 receiving internal row control signal ACTC and latch signal ACTLAT; an inverter 278 receiving internal precharge control signal PRCB; and an AND circuit 73 receiving an output signal of inverter 278 and an output signal of OR circuit 273 to generate word line drive timing signal RXT.

Latch signal ACTLAT of inverter latch 166 shown in FIG. 16 is driven to an active state at H level when internal row control signal ACTC attains an active state at H level and is held at the active state at H level until main precharge activating signal RCNTPA is applied subsequently to cause internal precharge control signal PRCA to fall to L level. Therefore, when a row active command is applied, internal row-related control signals maintains the active states according to latch signal ACTLAT even after internal row control signals ACTA to ACTC are driven in a one shot pulse form.

Note that in the configuration shown in FIG. 20, bit line equalize instructing signal BLEQ is generated from NOR circuit 270. The configuration corresponds to the configuration in which a bit line equalize/precharge circuit is provided in a corresponding memory block and the bit line precharge/equalize circuit is not arranged into a shared configuration. When bit line precharge/equalize circuits are arranged in a shared sense amplifier band, a bit line equalize instructing signal BLEQ is applied to a bit line equalize/precharge circuit in a corresponding sense amplifier band, being combined with a bit line equalize instructing signal from a memory block sharing a sense amplifier band with a corresponding memory block.

Composite gate 262 maintains row address decode enable signal RADE at H level when one of internal row control signal ACTA and latch signal ACTLAT is at H level and an output signal of inverter 278 is at H level. Therefore, row address decode enable signal RADE from the composite gate 62 maintains the H level until a precharge command is applied and internal precharge control signal PRCB rises to H level.

Row-related local control circuit 41 further includes: a latch 261 latching an X address applied through a buffer circuit in synchronization with clock signal CLK1 applied through an input buffer circuit; an X address decoder (word line address decoder) 263 decoding a word line address latched by latch circuit 61 in response to activation of row address decode enable signal RADE to generate word line select signal Add; a BLI driver 275 driving bit line isolation instructing signal BLI according to an output signal from OR circuit 269. A high voltage Vpp is applied to BLI driver 275 as one operating power supply voltage.

A logic level of bit line isolation instructing signal BLI is different according to a shared sense amplifier configuration to be used. Where bit line precharge/equalize circuits are provided to respective memory blocks and bit lines of a memory block are isolated from the respective sense amplifying circuits in a standby state, a selected memory block is connected to a sense amplifying circuit. Furthermore, alternatively, if all memory blocks are connected to corresponding sense amplifiers in a standby state and a non-selected memory block paired with a selected memory block is disconnected from a sense amplifier in a row selection, bit line isolation instructing signal BLI is applied to a bit line isolating circuit of a memory block sharing a sense amplifier with a corresponding memory block. A logic level of bit line isolation instructing signal BLI is, therefore, determined appropriately depending on a configuration of a memory array.

Word line drive timing signal RXT from AND circuit 276 is applied to word line driver (WL driver) 15ia. Word line driver 15ia drives a corresponding word line to a selected state according to word line selecting signal from X address decoder 263.

Figure 21:
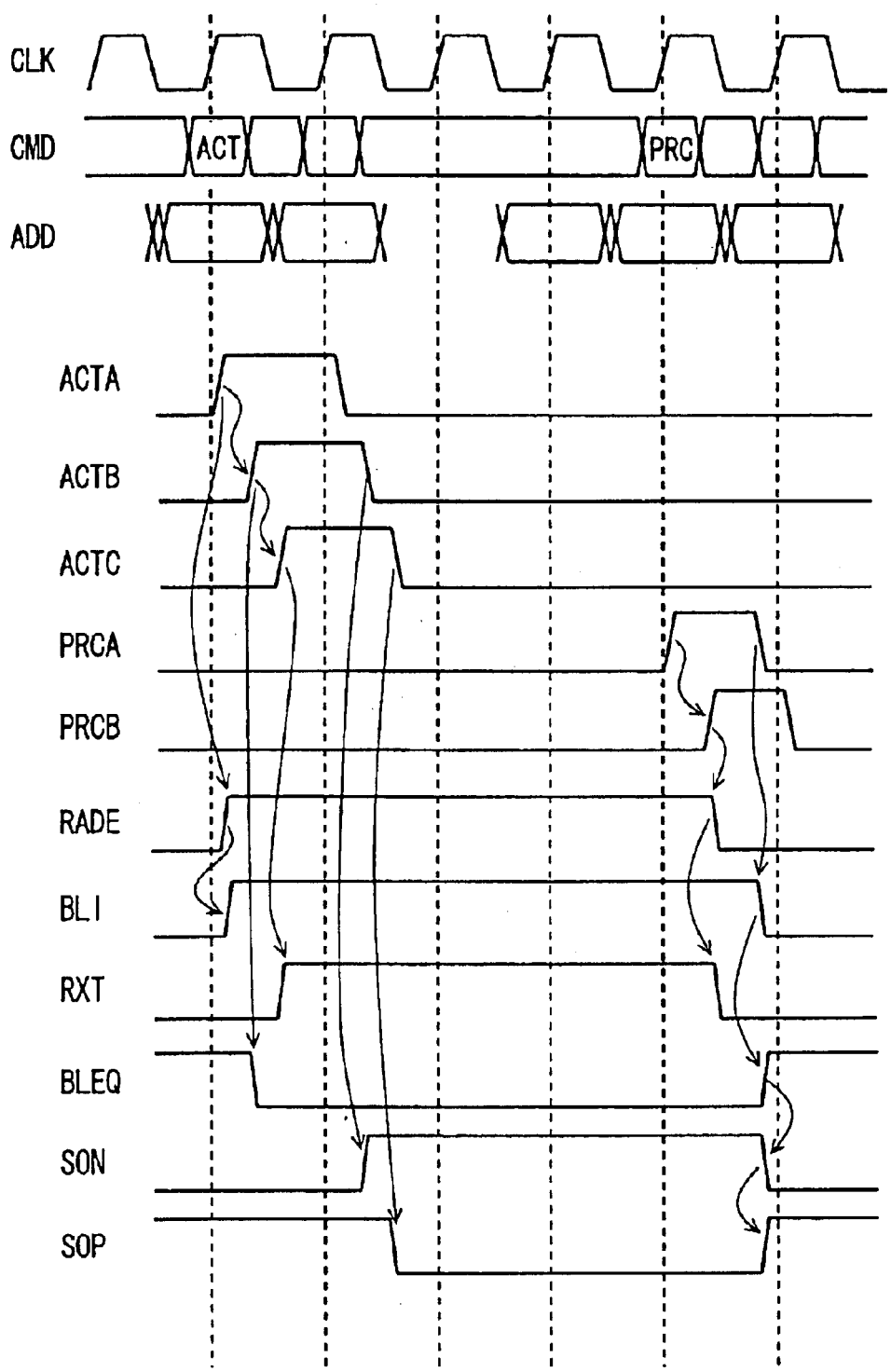
FIG. 21 is a timing diagram representing operations in the local row control signal generating section shown in FIG. 20.

Now, brief description will be given of operations of local row control signal generating section shown in FIG. 20 with reference to FIG. 21.

A state is considered where a corresponding memory block is selected according to block hit signal BHTA. In this case, local input buffer circuits 160a to 160c shown in FIG. 16 sequentially drive internal row control signals ACTA to ACTC to H level for a prescribed period according to main row activating signals RCLTAA to RCLTAC. When internal row control signal ACTA attains H level, row address decode enable signal RADE enters an active state at H level by composite gate 262, word line address XAD latched by latch 261 in synchronization with internal clock CLK1 is decoded to activate word line selecting signal Add.

When internal row control signal ACTA rises to H level, local input buffer circuit 160b is enabled and internal row control signal ACTB is set at H level for a prescribed period. When internal row control signal ACTB attains H level, bit line equalize instructing signal BLEQ attains L level to complete a precharge/equalize operation on bit lines in a corresponding memory block. When internal row control signal ACTA attains H level, an output signal of OR circuit 269 attains H level and in response, BLI driver 275 drives bit line isolation instructing signal BLI to H level or L level according an array configuration thereof.

When internal row control signal ACTB is driven to H level, internal row control signal ACTC is successively driven to H level (local input buffer circuit 160c is enabled). When internal row control signal ACTC is driven to H level, latch signal ACTLAT latched by inverter latch 166 shown in FIG. 16 is driven to H level. In row-related operation, precharge control signal PRCB is at L level and an output signal of inverter 278 is at H level. Therefore, when internal row control signal ACTC attains H level and an output signal of OR circuit 273 also attains H level, word line drive timing signal RXT is driven to H level by AND circuit 276 and WL driver 15ia drives word line WL to a selected state according to word line selecting signal Add from X address decoder 263.

When internal row control signal ACTB attains L level while latch signal ACTLAT is at H level, sense amplifier activating signal SON from AND circuit 271 is driven to an active state at H level to operate the N sense amplifier of a sense amplifying circuit. Then, when internal row control signal ACTC falls to L level, an output signal of inverter circuit 264 attains H level and sense amplifier activating signal SOP from NAND circuit 272 falls to L level.

Thereafter, this state is maintained during a period when latch signal ACTLAT is at H level.

When precharge command PRC is applied and block hit signal BHTA attains H level, internal precharge control signals PRCA<1:0> are driven to H level in precharge-related input section 110 shown in FIG. 16 according to main precharge activating signals RCNTPA<1:0> to RCNTPB<1:0>. When internal precharge control signal PRCA attains H level, then, internal precharge control signal PRCB rises to H level according to main precharge activating signals RCNTPB<1:0>.

When internal precharge control signal PRCB attains H level, an output signal of inverter 278 shown in FIG. 20 attains L level, word line drive timing signal RXT from AND circuit 276 attains L level, row address decode enable signal RADE from composite gate 262 turns into an inactive state at L level and a selected word line is driven to a non-selected state. Successively, when internal precharge control signal PRCA falls to L level, an output signal of logic circuit 168 of FIG. 16 attains L level and in response, latch signal ACTLAT attains L level. When latch signal ACTLAT attains L level, row-related control signal BLI, BLEQ, SON and SOP are driven to an inactive state and a memory block is driven to a standby state.

Internal precharge control signal PRCA is driven to L level when block hit signal BHT attains L level and one of main precharge control signals RCNTPA<1:0> attains L level. Internal precharge control signal PRCB is driven to L level when one of main precharge control signals RCNTPB<1:0> attains L level, Therefore, internal precharge control signals PRCA and PRCB are also generated using a configuration similar to the circuit shown in FIG. 17 and each has a pulse like waveform.

By utilizing plural sets of main control signals and a rising and a falling edge of different sets to generate internal row control signals, internal row control signals each with a correct waveform can be generated even if a main control signal is transmitted over a long interconnection length and even if a clock cycle time is short. Thus, internal control signals can be stably generated to perform a high speed operation.

Second Embodiment

Figure 22:
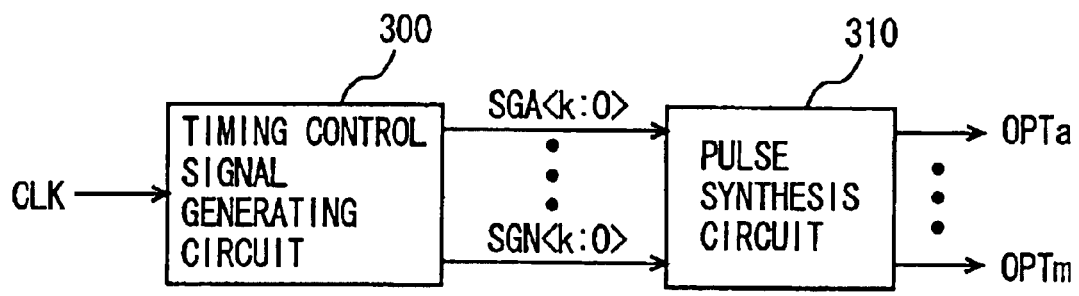
FIG. 22 is a diagram showing a configuration of a main part of a semiconductor integrated circuit device according to a second embodiment of the present invention.

FIG. 22 is a diagram showing a configuration of a main part of a semiconductor integrated circuit device according to a second embodiment of the present invention schematically. In FIG. 22, there are provided a timing control signal generating circuit 300 generating plural sets of timing control signals, SGA<k:0> to SGN<k:0>, according to clock signal CLK; and a pulse synthesis circuit 310 generating internal operation control signal OPTa to OPTm defining internal operation timing according to timing control signals SGA<k:0> to SGN<k:0>. Timing control signal generating circuit 300 includes a counter and plural sets of delay circuits, and one delay circuit is activated according to an output count of the counter to delay clock signal CLK for generating a timing control signal.

Pulse synthesis circuit 310 generates timing control signals OPTa to OPTm according to rising and falling edges of timing control signals of adjacent sets in a prescribed sequence among sets of timing control signals SGA<k:0> to SGN<k:0>. Therefore, as pulse synthesis circuit 310, there is provided a configuration similar to main control signals EN0 to EN2 shown previously in FIG. 11.

Figure 23:
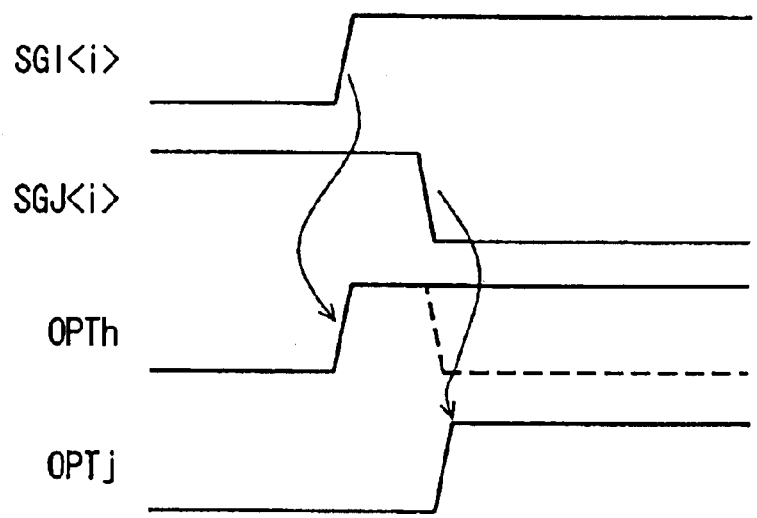
FIG. 23 is a timing diagram representing operations in a circuit shown in FIG. 22.

By using an internal operation control signal generating section shown in FIG. 22, internal operation control signals OPTh and OPTi can be generated according to a rising edge and a falling edge of respective timing control signals SGI<i> and SGJ<i> as shown in FIG. 23. Therefore, timing control signals SGI<i> and SGJ<i> can be slowly changed while securing a pulse width (an H level period and an L level period) thereof sufficiently, to generate operation timing control signals OPTh and OPTi changing at a short interval.

Internal operation control signal OPTh may be generated by a NAND operation on timing control signals SGI<i> and SGI<j> as shown with a broken line in FIG. 23. In the case of a small load on a drive signal line of operation timing control signal OPTh, there can be generated a pulse signal that changes correctly at a high speed.

Therefore, in general, where an internal timing is determined according to clock signal CLK in a semiconductor device operating in synchronization with clock signal CLK, a plurality of internal operation control signals can be correctly generated even with a high speed clock signal CLK.

Note that, in the first embodiment, there is shown the configuration of a part generating control signals for operations of row-related circuits. For generation of column-related operation control signals to column-related circuits, or the circuits performing column selection and writing/reading of data, a configuration according to the present invention can be applied similarly.

As described above, according to the present invention, plural sets of main control signals are utilized, and a rising edge of a main control signal of one set and a falling edge of a main control signal of another set are used to generate an internal control signal, internal control signals can be generated using main control signals each with a correct pulse waveform even in a high speed operation. Thus, an internal operation can be performed according to internal control signals at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:

a main control signal generating circuit for generating a plurality of main control signals, each main control signal being different in phase, in accordance with an operating mode instructing signal externally applied, said main control signal generating circuit activating one of a plurality of sets of main control signals, each set of main control signals including the plurality of main control signals according to the operating mode instructing signal, the plurality of sets of main control signals being selected to be activated in a prescribed sequence; and a local control signal generating circuit for generating local control signals according to the plurality of main control signals, said local control signal generating circuit receiving the main control signals of different sets to generate the local control signals in response to different directions of change of the main control signals, with respect to the different sets.

2. The semiconductor integrated circuit device according to claim 1, wherein said main control signal generating circuit deactivates the main control signals of a predetermined respective set, in a prescribed sequence, in response to activation of a predetermined main control signal in each of the plurality of sets of the main control signals.

3. The semiconductor integrated circuit device according to claim 1, further comprising a local operation control circuit for generating local operation control signals for controlling an operation designated by the operating mode instructing signal, in accordance with the local control signals.

4. The semiconductor integrated circuit device according to claim 3, wherein the local operation control signals are no fewer in number than the local control signals.

5. A semiconductor integrated circuit comprising:

a plurality of local circuits, each local circuit performing a designated operation, when active;

a main control signal generating circuit provided commonly to said plurality of local circuits, for generating a plurality of main control signals different in phase from each other, according to an operating mode instructing signal externally applied, said main control signal generating circuit driving one of a plurality of sets, each including the plurality of main control signals in a prescribed sequence to a selected state in accordance with the operating mode instructing signal; and a plurality of local control circuits corresponding to the respective local circuits, for generating local operation control signals supplied to corresponding local circuits in accordance with the main control signals, the local control circuit receiving the main control signals of different sets and generating the local operation control signals in response to different directions of change of the main control signals in the respective different sets.

6. The semiconductor integrated circuit device according to claim 5, wherein each of the local control circuits includes:

a local control signal generating circuit for generating a local control signal for a corresponding local circuit according to the plurality of main control signals; and a local operation control signal generating circuit for generating an operation control signal as the local operation control signal, supplied to the corresponding local circuit in accordance with the local control signal.

7. The semiconductor integrated circuit device according to claim 5, further comprising a plurality of local decode circuits provided in correspondence to the respective local circuits, each local decode circuit for generating a local circuit select signal indicating whether a corresponding local circuit is designated according to an address signal externally applied, each local control circuit being activated in response to activation of a corresponding local circuit select signal to generate the local operation control signals.

8. The semiconductor integrated circuit device according to claim 6, wherein each of the local circuits includes a plurality of memory cells arranged in rows and columns, and the local operation control signals control operations related to a selecting operation of said plurality of memory cells.

9. The semiconductor integrated circuit device according to claim 5, wherein said main control signal generating circuit deactivates the main control signals of a predetermined set, in a prescribed sequence, in response to activation of a prescribed main control signal in each of the plurality of sets of the main control signals.

* * * * *